(12) United States Patent
Arisaka et al.

(10) Patent No.: US 9,735,098 B2
(45) Date of Patent: Aug. 15, 2017

(54) WIRING SUBSTRATE AND SEMICONDUCTOR DEVICE

(71) Applicant: SHINKO ELECTRIC INDUSTRIES CO., LTD., Nagano-shi (JP)

(72) Inventors: Hiromu Arisaka, Nishinomiya (JP); Noriyoshi Shimizu, Nagano (JP); Akio Rokugawa, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 0 days.

(21) Appl. No.: 15/342,345

(22) Filed: Nov. 3, 2016

(65) Prior Publication Data

US 2017/0141023 A1    May 18, 2017

(30) Foreign Application Priority Data

Nov. 18, 2015  (JP) ................... 2015-225875

(51) Int. Cl.
*H01L 23/498* (2006.01)
*H01L 23/00* (2006.01)
*H01L 21/48* (2006.01)

(52) U.S. Cl.
CPC .... *H01L 23/49838* (2013.01); *H01L 21/4853* (2013.01); *H01L 23/49811* (2013.01); *H01L 23/49822* (2013.01); *H01L 23/49827* (2013.01); *H01L 23/49866* (2013.01); *H01L 24/17* (2013.01); *H01L 2224/13147* (2013.01); *H01L 2224/16238* (2013.01); *H01L 2924/01028* (2013.01); *H01L 2924/15738* (2013.01)

(58) Field of Classification Search
CPC ......... H01L 23/49838; H01L 23/49822; H01L 23/49866; H01L 23/49827; H01L 24/17; H01L 23/49811; H01L 21/4853; H01L 2224/16238; H01L 2924/01028; H01L 2224/13147
See application file for complete search history.

(56) References Cited

U.S. PATENT DOCUMENTS 7,417,326 B2 * 8/2008 Ikumo ................ H01L 23/3171
                                                257/737
9,560,739 B2 * 1/2017 Nishida ................ H05K 3/3452

FOREIGN PATENT DOCUMENTS

JP        2001-110836 A    4/2001

* cited by examiner

*Primary Examiner* — David Vu
(74) *Attorney, Agent, or Firm* — Tarolli, Sundheim, Covell & Tummino LLP

(57) ABSTRACT

A wiring substrate including an insulation layer, a connection terminal projecting from an upper surface of the insulation layer, a protective insulation layer formed on the upper surface of the insulation layer covering a lower side surface of the connection terminal, and a cover layer covering an upper side surface and an upper surface of the connection terminal exposed from the protective insulation layer. The protective insulation layer includes an upper surface defining a protrusion bulged upward around the connection terminal. The protrusion includes a peak, a first slope inclined downward from the peak and extending toward the connection terminal, and a second slope inclined downward from the peak and extending away from the connection terminal. The cover layer further covers the first slope, the peak, and a part of the second slope.

7 Claims, 13 Drawing Sheets

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2015-225875, filed on Nov. 18, 2015, the entire contents of which are incorporated herein by reference.

FIELD

This disclosure relates to a wiring substrate, a semiconductor device, and a method for manufacturing a wiring substrate.

BACKGROUND

Electronic components such as semiconductor chips are mounted on wiring substrates of various shapes and structures. Semiconductor chips have become highly sophisticated. Further, semiconductor chips are mounted on wiring substrates in larger scales of integration. As a result, the demand for finer wiring has increased in wiring substrates on which semiconductor chips are mounted.

Japanese Laid-Out Patent Publication No. 2001-110836 describes a wiring substrate in which a wiring pattern is formed on an outermost insulation layer and metal posts are formed on the wiring pattern. In the wiring substrate, a resin layer is formed on the upper surface of the outermost insulation layer to cover the entire surface of the wiring pattern and part of the side surface of each metal post. The upper end of each post is exposed from the resin layer. The upper surface of the resin layer is flat.

In the wiring substrate, a surface-processed layer is formed on the portion of each metal post exposed from the resin layer to improve the corrosion resistance of the metal post. When, for example, flip-chip-connecting a solder layer of a semiconductor chip to the metal post, the surface-processed layer improves the connecting properties of the metal post and a solder layer. However, when the level of adhesion is low between the surface-processed layer and the resin layer, a gap may be formed between the lower surface of the surface-processed layer and the upper surface of the resin layer. When such a gap is formed, the molten solder layer may enter the gap when the flip-chip connection is performed. When solder enters the gap, electromigration occurs between the metal post and the solder layer. This lowers the connection reliability of the solder layer with respect to the metal post and the surface-processed layer.

SUMMARY

One embodiment of a wiring substrate includes an insulation layer, a rod-shaped connection terminal, a protective insulation layer, and a cover layer. The connection terminal projects upward from an upper surface of the insulation layer. The connection terminal is adapted to be connected to an electronic component. The protective insulation layer is formed on the upper surface of the insulation layer to cover a lower side surface of the connection terminal. The cover layer covers an upper surface of the connection terminal and an upper side surface of the connection terminal that are exposed from the protective insulation layer. The protective insulation layer includes an upper surface that defines a protrusion bulged upward around the connection terminal. The protrusion includes a peak, a first slope inclined downward from the peak and extending toward the connection terminal that is located in the proximity of the peak, and a second slope inclined downward from the peak and extending away from the connection terminal that is located in the proximity of the peak. The cover layer further covers the first slope, the peak, and a part of the second slope.

Other embodiments and advantages thereof will become apparent from the following description, taken in conjunction with the accompanying drawings, illustrating by way of example the principles of this disclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1A:
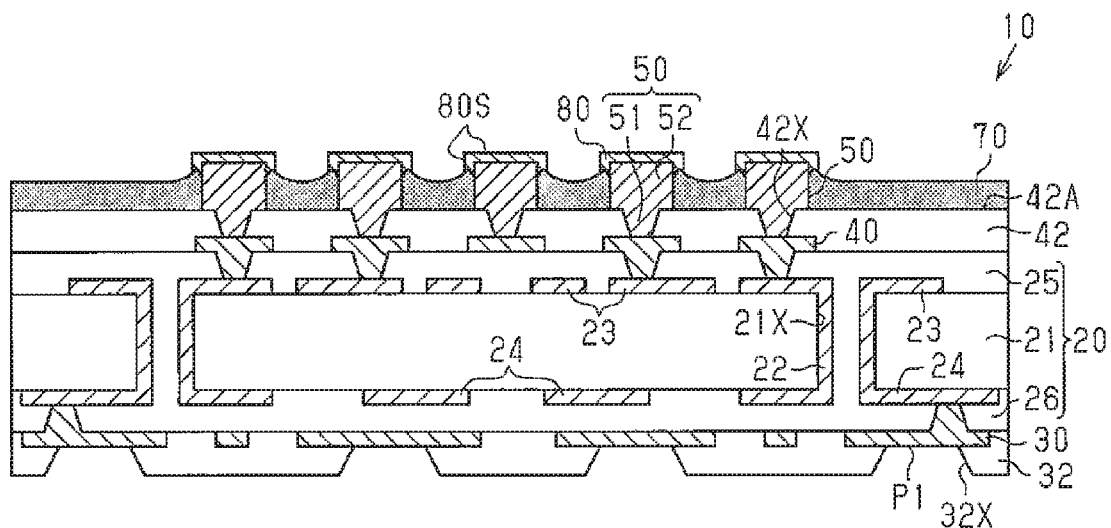
FIG. 1A is a schematic cross-sectional view of one embodiment of a wiring substrate.

One embodiment will now be described with reference to the accompanying drawings. In the drawings, elements are illustrated for simplicity and clarity and have not necessarily been drawn to scale. To facilitate understanding, hatching lines may not be illustrated or be replaced by shadings in the cross-sectional drawings.

The structure of a wiring substrate 10 will first be described.

With reference to FIG. 1A, the wiring substrate 10 includes a main substrate body 20 located at the middle of the wiring substrate 10 in the thickness-wise direction. The main substrate body 20 includes a core substrate 21, through electrodes 22 formed in through holes 21X that extend through the core substrate 21 in the thickness-wise direction, a wiring layer 23 formed on the upper surface of the core substrate 21, and a wiring layer 24 formed on the lower surface of the core substrate 21. The through electrodes 22 connect the wiring layers 23 and 24 to each other. The main substrate body 20 includes an insulation layer 25, which is formed on the upper surface of the core substrate 21 covering the wiring layer 23, and an insulation layer 26, which is formed on the lower surface of the core substrate 21 covering the wiring layer 24.

The core substrate 21 may be formed from, for example, a reinforced insulative resin obtained by impregnating reinforcement material, such as a woven cloth or non-woven cloth of glass, aramid, or liquid crystal polymer (LCP) fibers, with a thermosetting resin such as an epoxy resin or a polyimide resin. The through electrodes 22 and the wiring layers 23 and 24 may be formed from, for example, copper (Cu) or a copper alloy. The insulation layers 25 and 26 may be formed from, for example, an organic resin, such as an epoxy resin or a polyimide resin, or a resin material obtained by mixing such an organic resin with a filler, such as silica or alumina.

A wiring layer 30 is formed on the lower surface of the insulation layer 26. The wiring layer includes via wirings, which extend through the insulation layer 26 in the thickness-wise direction, and wiring patterns, which are formed on the lower surface of the insulation layer 26 and electrically connected to the wiring layer 24 by the via wirings.

A solder resist layer 32 formed on the lower surface of the insulation layer 26 partially covers the wiring layer 30. The solder resist layer 32 may be formed from, for example, an insulative resin such as an epoxy resin or an acrylic resin. The solder resist layer 32 includes openings 32X. Portions of lower surface of the wiring layer 30 exposed from the openings 32X function as external connection pads P1. The external connection pads P1 are connected to external connection terminals 96 (refer to FIG. 2A) that are used to mount the wiring substrate 10 to a mounting substrate such as a motherboard.

A surface-processed layer may be formed, when necessary, on the wiring layer 30 (external connection pads P1) exposed from the openings 32X. Examples of the surface-processed layer include a gold (Au) layer, a nickel (Ni) layer/Au layer (stack of metal layers in which Ni layer and Au layer are formed in this order), and a Ni layer/palladium (Pd) layer/Au layer (stack of metal layers in which Ni layer, Pd layer, and Au layer are formed in this order). The Au layer, Ni layer, and the Pd layer may be, for example, an electroless plating metal layer formed through electroless plating. The Au layer is a metal layer formed from Au or a Au alloy. The Ni layer is a metal layer formed from Ni or a Ni alloy. The Pd layer is a metal layer formed from Pd or a Pd alloy. Alternatively, the surface-processed layer may be formed by performing an organic solderability preservative (OSP) process on the surface of each external connection pad P1. For example, when performing the OSP process, an organic film of an azole compound or an imidazole compound is formed as the surface-processed layer on the surface of each external connection pad P1. The wiring layer 30 exposed from each opening 32X may be used as an external connection terminal. Alternatively, when a surface-processed layer is formed on the wiring layer, the surface-processed layer may be used as an external connection terminal.

A wiring layer 40 is formed on the upper surface of the insulation layer 25. The wiring layer 40 includes via wirings, which extend through the insulation layer 25 in the thickness-wise direction, and wiring patterns, which are formed on the upper surface of the insulation layer 25 and electrically connected to the wiring layer 23 by the via wirings.

An insulation layer 42 that covers the wiring layer 40 is formed on the upper surface of the insulation layer 25. The insulation layer 42 may be formed from, for example, an insulative resin, the main component of which is a photosensitive resin such as a phenol resin or a polyimide resin. The insulation layer 42 may include, for example, a filler of silica or alumina. The material of the insulation layer 42 is not limited to an insulative resin of which the main component is a photosensitive resin. For example, the insulation layer 42 may be formed from the same insulative resin as the insulation layers 25 and 26.

Through holes 42X, which expose portions of the upper surface of the wiring layer 40, extend through the insulation layer 42 at certain locations of the wiring layer 40. Each through hole 42X is tapered so that the diameter decreases as viewed in FIG. 1A from the upper side (upper surface 42A of insulation layer 42) to the lower side (lower surface of insulation layer 42). For example, each through hole 42X has the form of an reversed truncated cone in which the upper open end has a larger diameter than the lower open end.

A wiring layer 50 is formed on the upper surface 42A of the insulation layer 42. The wiring layer 50 includes via wirings 51, which are formed in the through holes 42X, and connection terminals 52, which project toward the upper side from the upper surface 42A of the insulation layer 42.

The through holes 42X are filled with, for example, the via wirings 51. Each via wiring 51 is shaped in conformance with the corresponding through hole 42X. Each connection terminal 52 is, for example, a rod-shaped connection terminal (metal post) extending toward the upper side from the upper surface of a corresponding one of the via wirings 51. The connection terminal 52 is, for example, formed integrally with the corresponding via wiring 51. The connection terminal 52 functions as an electronic component mounting pad that is electrically connected to an electronic component (e.g., semiconductor chip 91 illustrated in FIG. 2A). The via wirings 51 and the connection terminals 52 may be formed from, for example, copper or a copper alloy.

A protective insulation layer 70 is formed on the upper surface 42A of the insulation layer 42. The protective insulation layer 70 partially contacts and covers the side surface of each connection terminal 52. For example, the protective insulation layer 70 covers the entire upper surface 42A of the insulation layer 42 around each connection terminal 52. The upper portion of each connection terminal 52 is exposed from the protective insulation layer 70. More specifically, the upper surface and upper side surface of each connection terminal 52 are exposed from the protective insulation layer 70.

The protective insulation layer 70 may be formed from, for example, the same material as the insulation layer 42. That is, the protective insulation layer 70 may be formed from, for example, an insulative resin of which the main component is a photosensitive resin such as a phenol resin or a polyimide resin. However, the protective insulation layer 70 does not necessarily have to be formed from the same material as the insulation layer 42 and may be formed from, for example, the same material as the solder resist layer 32.

A surface-processed layer 80 that serves as a cover layer is formed on the upper side surface and the upper surface of each connection terminal 52 exposed from the protective insulation layer 70. For example, the surface-processed layer 80 covers the entire upper side surface and the entire upper surface of the connection terminal 52 exposed from the protective insulation layer 70. The surface-processed layer 80 also covers portions of the upper surface of the protective insulation layer 70. The surface-processed layer 80 functions to prevent oxidation or the like of the surface of each connection terminal 52. Further, the surface-processed layer 80 functions as an electronic component mounting pad that is electrically connected to an electronic component.

Figure 1B:
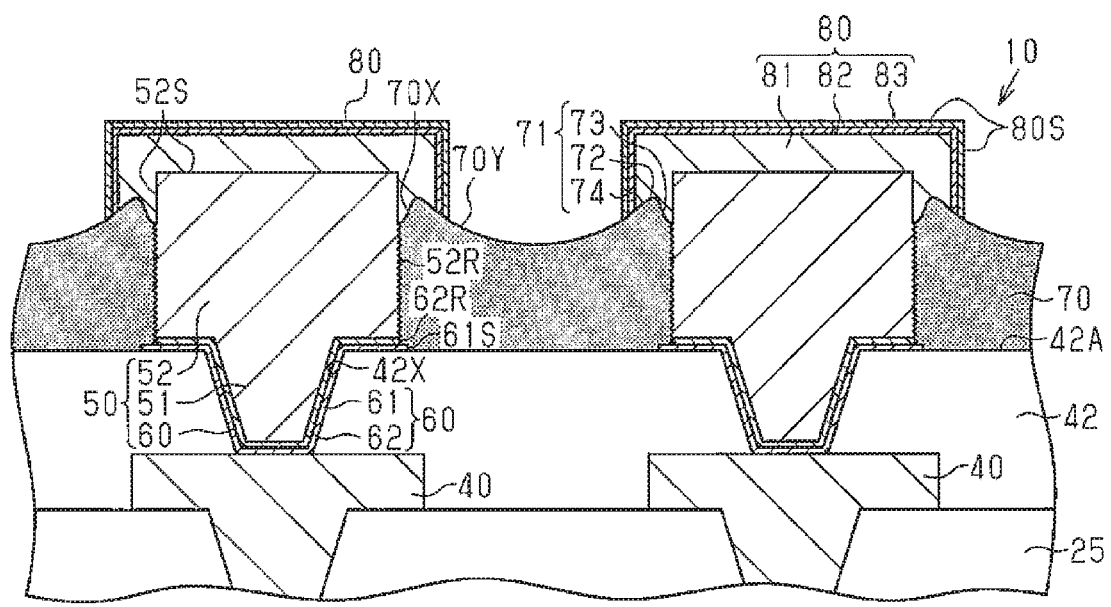
FIG. 1B is a partially enlarged view of the wiring substrate illustrated in FIG. 1A.

The structures of the wiring layer 50, the protective insulation layer 70, and the surface-processed layer 80 will now be described with reference to FIG. 1B.

In addition to the via wirings 51 and the connection terminals 52, the wiring layer 50 further includes a seed layer 60. The seed layer 60 continuously covers the upper surface of the wiring layer 40 exposed by each through hole 42X, a wall surface of the insulation layer 42 that defines the through hole 42X, and the upper surface 42A of the insulation layer 42. In the present example, the seed layer 60 is a two-layer structure that includes metal films 61 and 62. The metal film 61 continuously covers the upper surface of the wiring layer 40 exposed by the through hole 42X, the wall surface of the insulation layer 42 that defines the through hole 42X, and the upper surface 42A of the insulation layer 42. The metal film 62 covers the upper surface of the metal film 61. The side surface of the metal film 61 on the upper surface 42A of the insulation layer 42 extends further toward the outer side from the side surface of the connection terminal 52 and the side surface of the metal film 62. In other words, the metal film 61 has a larger contour than the connection terminal 52 and the metal film 62 in a plan view.

The metal films 61 and 62 may be formed by performing, for example, sputtering. The metal film 61 functions as, for example, a metal barrier film that reduces the diffusion of Cu in the insulation layer 42 from the metal film 62 and the via wirings 51 (e.g., Cu layer). It is preferred that the metal film 61 be formed from a metal having a higher level of adhesion to the insulation layer 42 than the metal (e.g., Cu) of the metal film 62. Further, it is preferred that the metal film 61 be formed from a metal having a higher level of corrosion resistance than the metal (e.g., Cu) of the metal film 62. Such material of the metal film 61 may be, for example, titanium (Ti), titanium nitride (TiN), titanium tantalum (TaN), tantalum (Ta), or chromium (Cr). The metal film 62 may be formed from, for example, copper or a copper alloy. The metal film 61 has a thickness of, for example, approximately 20 to 50 nm, and the metal film 62 has a thickness of, for example, approximately 100 to 300 nm.

The via wirings 51 are formed on the metal film 62. In the present example, the through holes 42X are filled with the via wirings 51 that are formed on the metal film 62 (seed layer 60). Although the seed layer 60 is distinguished here from the via wirings 51, the combination of the seed layer 60 and the via wiring 51 formed in each through hole 42X may be referred to as the via wiring 51.

Each connection terminal 52 is formed on the corresponding via wiring 51 and the seed layer 60 formed on the upper surface 42A of the insulation layer 42. The connection terminal 52 is, for example, cylindrical. The connection terminal 52 may have a height of, for example, approximately 10 to 20 μm and a diameter of, for example, approximately 20 to 30 μm. Further, the connection terminals 52 may be laid out at a pitch of, for example, approximately 40 to 60 μm. Although the seed layer 60 is distinguished here from each connection terminal 52, the combination of the seed layer 60 and the connection terminal 52 formed on the upper surface 42A of the insulation layer 42 may be referred to as the connection terminal 52.

The side surface of each connection terminal 52 is, for example, partially roughened. In the present example, the lower side surface of each connection terminal 52 covered by the protective insulation layer 70 is a roughened surface 52R. The side surface of the metal film 62 is also a roughened surface 62R. The upper side surface and the upper surface of each connection terminal 52 exposed from the protective insulation layer 70 are each a low-roughness surface 52S having a lower roughness than the roughened surfaces 52R and 62R. Further, the side surface of the metal film 61 is also a low-roughness surface 61S having a lower roughness than the roughened surfaces 52R and 62R.

From the viewpoint of adhesion with the protective insulation layer 70, the roughened surfaces 52R and 62R have a larger surface roughness than the low-roughness surfaces 52S and the upper surface of the wiring layer 40. The roughened surfaces 52R and 62R may have, for example, a surface roughness Rz value of approximately 2000 to 4000 nm. The low-roughness surfaces 52S and 61S may have, for example, a surface roughness Rz value of approximately 500 to 1000 nm. The surface roughness Rz value is a ten-point mean roughness. More specifically, the surface roughness Rz value is obtained by sampling a portion corresponding to a reference length from a roughness curve in the direction of a mean line, measuring heights from the mean line in the sampled portion, and adding the mean of the absolute values of the heights of peaks from the highest one to the fifth highest one to the mean of the absolute values of the heights of peaks from the lowest one to the fifth lowest one.

The protective insulation layer 70 contacts and entirely covers the side surfaces of the metal film 61 (low-roughness surfaces 61S), the side surfaces of the metal film 62 (roughened surfaces 62R), and the lower side surface of each connection terminal 52 (roughened surface 52R). The upper side surface and the upper surface of each connection terminal 52 (low-roughness surfaces 52S) are exposed from the protective insulation layer 70.

The protective insulation layer 70 includes protrusions 71 that are defined by the upper surface of the protective insulation layer 70 and upwardly bulged around each connection terminal 52. That is, each protrusion 71 is located in the proximity of the corresponding connection terminal 52. The protrusion 71, for example, surrounds the connection terminal 52 in a plan view. The protrusion 71 is, for example, annular and extends around the circumference of the connection terminal 52. The protrusion 71 includes a peak 72 and two slopes 73 and 74. The slope 73 is inclined downward from the peak 72 and extending toward the connection terminal 52 that is located in the proximity of the peak 72. The slope 74 is inclined downward from the peak 72 and extending away from the connection terminal 52 that is located in the proximity of the peak 72. That is, the slope 74 extends away from the slope 73.

The cross-sectional shape of the peak 72 is not particularly limited. In the present example, the peak 72 is round in a cross-sectional view. Instead, the peak 72 may have a sharp cross-sectional shape like a needle or a flat cross-sectional shape.

The slope 73 may be, for example, inclined in a curved manner. The surface of the slope 73 and the upper side surface of the corresponding connection terminal 52 exposed from the insulation layer 70 define a recess 70X. In other words, the recess 70X is defined between the peak 72 and the upper side surface of the connection terminal 52. The recess 70X is, for example, recessed in a curved manner from the peak 72. In the same manner, the slope 74 is, for example, inclined in a curved manner. The slopes 74 of adjacent protrusions 71 between adjacent connection terminals 52 define a recess 70Y. The recess 70Y is, for example, recessed in a curved manner from the peaks 72. The recess 70Y may have, for example, a flat bottom surface. The slopes 73 and 74 may be inclined straight in a cross-sectional view.

The recess 70X may have a width of, for example, approximately 2 to 5 μm and a depth of, for example, approximately 1 to 3 μm. The recess 70Y may have a depth of, for example, approximately 2 to 5 μm.

The surface-processed layer 80 entirely covers the surface (upper surface and upper side surface) of each connection terminal 52 exposed from the protective insulation layer 70. The surface-processed layer 80 partially covers each protrusion 71 of the protective insulation layer 70. In the present example, the surface-processed layer 80 covers the slope 73, the peak 72, and part of the slope 74. For example, the surface-processed layer 80 covers the upper surface of the protective insulation layer 70 from the end of the slope 73 contacting the connection terminal 52 to an intermediate part of the slope 74. Accordingly, the surface-processed layer 80 covers the upwardly bulging portion of the protrusion 71. For example, the recess 70X is filled with the surface-processed layer 80.

In the present example, the surface-processed layer 80 is a plating layer having a three-layer structure including a metal layer 81, a metal layer 82, and a metal layer 83 formed in this order from the surface of each connection terminal 52.

The metal layer 81 entirely covers the upper side surface and the upper surface of each connection terminal 52 that are exposed from the protective insulation layer 70. Further, the metal layer 81 partially covers each protrusion 71 of the protective insulation layer 70. In the present example, the metal layer 81 covers the slope 73, the peak 72, and part of the slope 74. For example, the recess 70X is filled with the metal layer 81.

The metal layer 81, for example, functions to prevent the diffusion of Cu from the connection terminals 52 to the metal layers 82 and 83. The composition of the material of the metal layer 81 and the thickness of the metal layer 81 are determined taking into account characteristics such as the diffusion prevention effect, the corrosion resistance effect that prevents corrosion of the connection terminals 52, and the adhesion with the metal layer 82 or the protective insulation layer 70. The metal layer 81 may be formed from, for example, a metal material that includes Ni. That is, the metal layer 81 may be formed from Ni or a Ni alloy. The thickness of the metal layer 81 may be, for example, greater than the width of the recess 70X. For example, the thickness of the metal layer 81 may be, for example, approximately 3 to 7 μm.

The metal layer 82 entirely covers the surface of the metal layer 81. Further, the metal layer 82 partially covers each slope 74 of the protective insulation layer 70. The metal layer 82 may be formed from, for example, Pd or a Pd alloy. The metal layer 82 may have a thickness of, for example, approximately 0.1 to 0.5 μm.

The metal layer 83 entirely covers the surface of the metal layer 82. Further, the metal layer 83 partially covers each slope 74 of the protective insulation layer 70. The lower surface of the metal layer 83 contacts the upper surface (inclined surface) of the slope 74. The metal layer 83 may be formed from, for example, a metal that has a higher resistance to oxidation than the metal (Cu) forming the connection terminals 52. For example, the metal layer 83 may be formed from Au or an Au alloy. The metal layer 83 may have a thickness of, for example, approximately 0.1 to 0.3 μm.

The lower surfaces of the metal layers 81 to 83 are shaped in conformance with the protrusions 71 (slope 73, peak 72, and part of slope 74). Thus, the lower surfaces of the metal layers 81 to 83 at a portion covering the slope 74 are upwardly inclined toward the peak 72 from the outermost edge of the metal layer 83 (i.e., outermost edge of surface-processed layer 80). The inclination angle is set to be acute relative to a horizontal plane that is parallel to the upper surface 42A of the insulation layer 42.

The outermost surface of the surface-processed layer 80 formed by the metal layers 81 to 83, that is, the side surface and the upper surface of the metal layer 83 are shaped in conformance with the upper side surface and the upper surface (low-roughness surfaces 52S) of the connection terminal 52. In the same manner as the low-roughness surfaces 52S, the side surface and the upper surface of the surface-processed layer 80 are low-roughness surfaces 80S that have a smaller roughness than the roughened surface 52R. The low-roughness surfaces 80S have a surface roughness Rz value of, for example, approximately 500 to 1000 nm.

In the present embodiment, the surface-processed layer 80 is a plating layer in which the metal layer 81 that is a nickel layer (Ni layer), the metal layer 82 that is a palladium layer (Pd layer), and the metal layer 83 that is a gold layer (Au layer) are sequentially formed from the surface of each connection terminal 52. Instead, the surface-processed layer 80 may be, for example, a plating layer in which an Ni layer and an Au layer are sequentially formed from the surface of each connection terminal 52 or a plating layer in which a Ni layer, a Pd layer, and a silver (Ag) layer are sequentially formed from the surface of each connection terminal 52. Alternatively, the surface-processed layer 80 may be, for example, a plating layer in which a Ni layer, a Pd layer, a Ag layer, and an Au layer are sequentially stacked from the surface of each connection terminal 52. Further, the surface-processed layer 80 may be, for example, an OSP film formed through an OSP process. The OSP film may be, for example, an organic film of an azole compound or an imidazole compound.

The structure of the semiconductor device 90 will now be described with reference to FIGS. 2A and 2B.

Figure 2A:
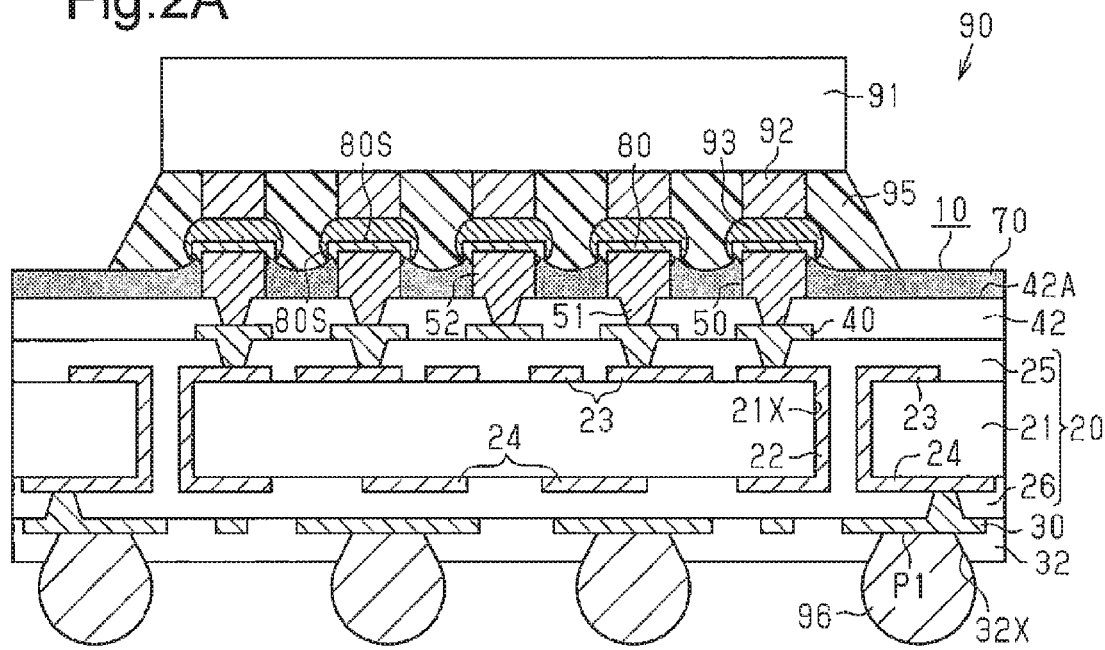
FIG. 2A is a schematic cross-sectional view of a semiconductor device that includes the wiring substrate illustrated in FIG. 1A.

Referring to FIG. 2A, the semiconductor device 90 includes the wiring substrate 10, at least one (here, one) semiconductor chip 91, underfill material 95, and external connection terminals 96.

The semiconductor chip 91 is flip-chip-mounted on the wiring substrate 10. The semiconductor chip 91 includes a circuit formation surface (here, lower surface). Connection terminals 92 are arranged on the circuit formation surface. A solder layer 93 joins the connection terminals 92 with the surface-processed layer 80 of the wiring substrate 10. Accordingly, the semiconductor chip 91 is electrically connected to the surface-processed layer 80 and the wiring layer 50 by the connection terminals 92 and the solder layer 93.

The semiconductor chip 91 may be, for example, a logic chip such as a central processing unit (CPU) chip or a graphics processing unit (GPU) chip. Further, the semiconductor chip 91 may be, for example, a memory chip such as a dynamic random access memory (DRAM) chip, a static random access memory (SRAM) chip, or a flash memory. A plurality of semiconductor chips 91 including the combination of a logic chip and a memory chip may be mounted on the wiring substrate 10.

The connection terminals 92 may be, for example, metal posts. Each connection terminal 92 is a rod-shaped connection terminal extending toward the lower side from the circuit formation surface of the semiconductor chip 91. The connection terminal 92 is, for example, cylindrical. The connection terminal 92 may be formed from, for example, copper or a copper alloy. Instead of metal posts, the connection terminals 92 may be, for example, metal bumps such as gold bumps.

Figure 2B:
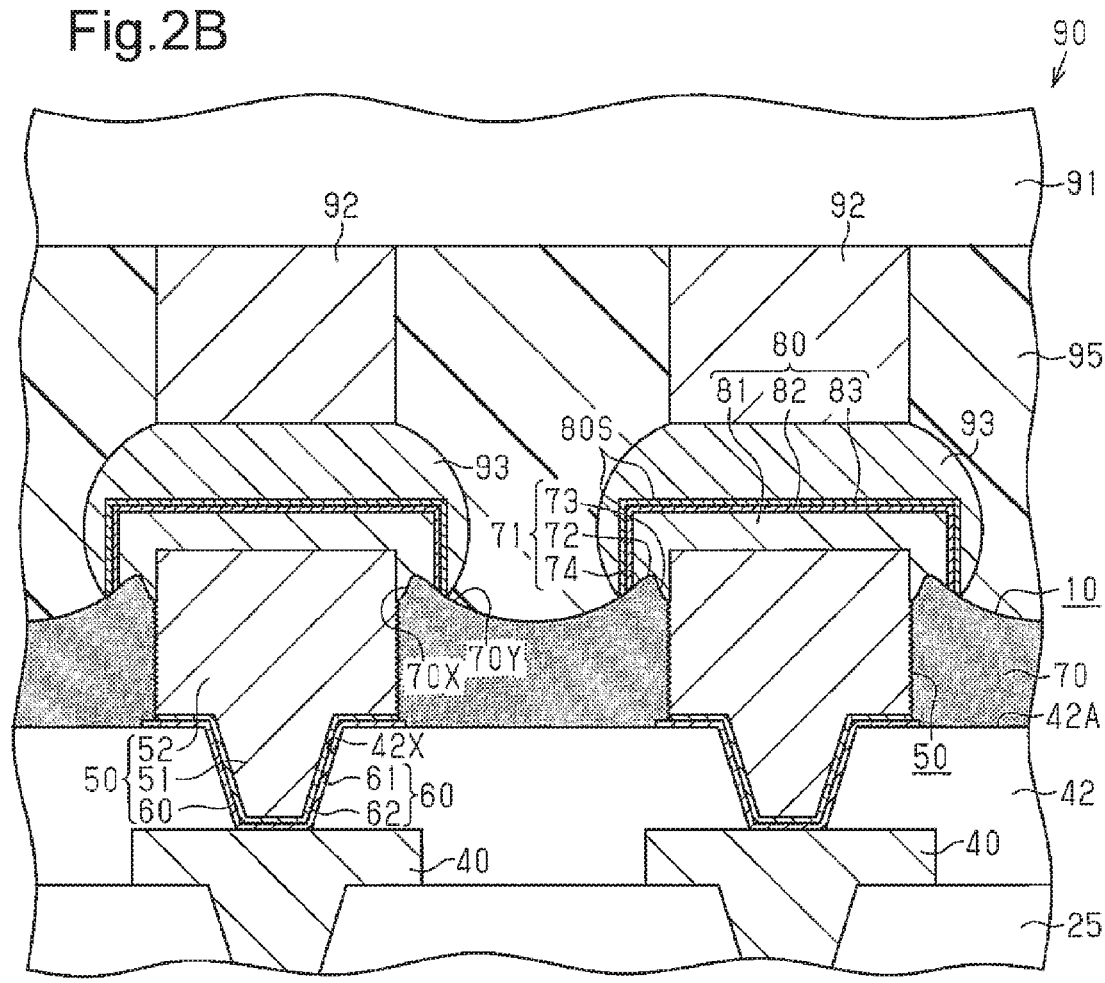
FIG. 2B is a partial, enlarged cross-sectional view of the semiconductor device illustrated in FIG. 2A.

Referring to FIG. 2B, the solder layer 93 joins the surface-processed layer 80 and the connection terminals 92. The solder layer 93 covers, for example, the surfaces (side surface and upper surface) of the metal layer 83, that is, the outermost surface (low-roughness surfaces 80S) of the surface-processed layer 80. Here, the metal layer 83 may be eliminated when the Au in the metal layer 83 is diffused to the solder layer 93, and the metal layer 82 may become the outermost layer of the surface-processed layer 80. In this case, the solder layer 93 covers the upper surface and the side surfaces of the metal layer 82. The solder layer 93 may be, for example, lead-free solder plating. The solder plating may be formed from, for example, Sn-silver (Ag), Sn—Cn, Sn—Ag—Cu, or Sn—Bi lead-free solder.

Referring to FIG. 2A, the gaps between the wiring substrate 10 and the semiconductor chip 91 are filled with the underfill material 95. The underfill material 95 may be formed from, for example, an insulative resin such as an epoxy resin.

The external connection terminals 96 are formed on the external connection pads P1 of the wiring substrate 10. The external connection terminals 96 are, for example, electrically connected to pads of a mounting substrate such as a motherboard (not illustrated). The external connection terminals 96 may be, for example, solder balls or lead pins. In the present embodiment, the external connection terminals 96 are solder balls.

The operation of the wiring substrate 10 and the semiconductor device 90 will now be described. First, a wiring substrate 200 of a comparative example will be described with reference to FIGS. 13A and 13B.

Figure 13A:
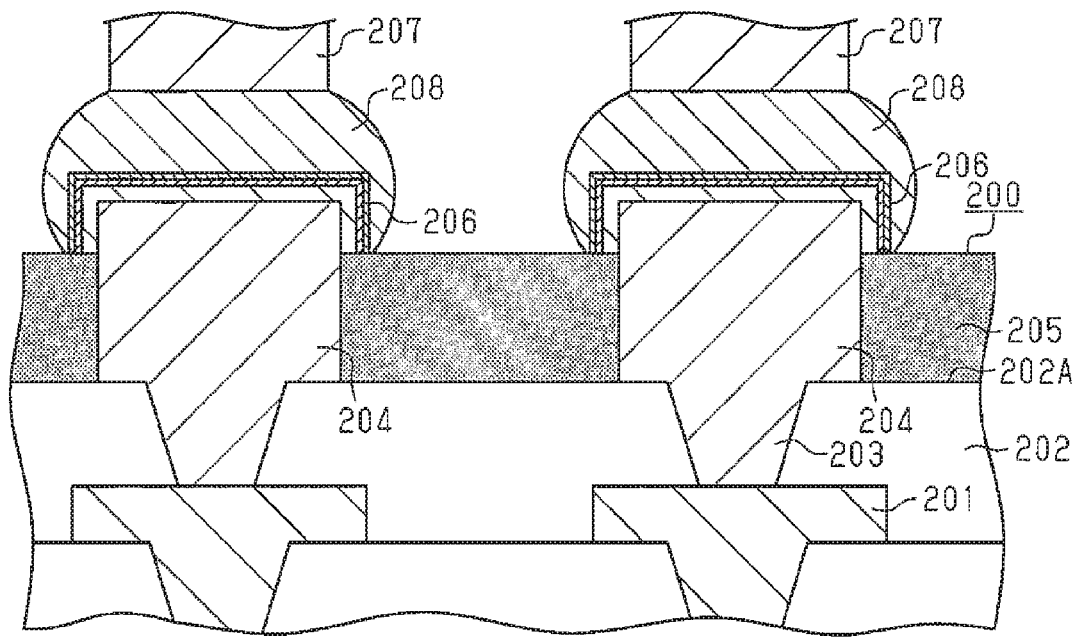
FIG. 13A is a partial, schematic cross-sectional view illustrating a comparative example of a semiconductor device.
Figure 13B:
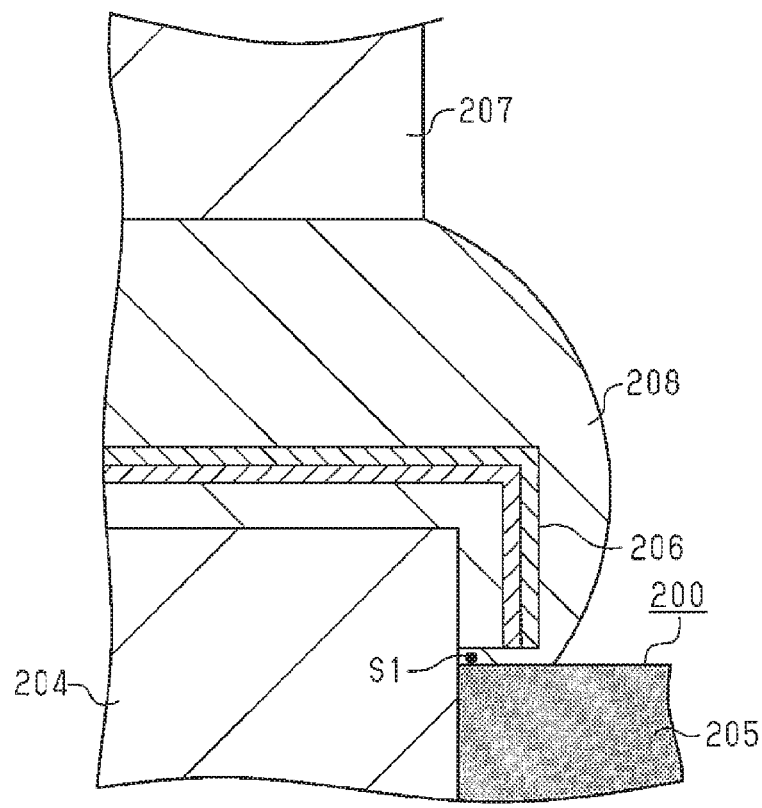
FIG. 13B is a partial, enlarged cross-sectional view of the semiconductor device illustrated in FIG. 13A.

Referring to FIG. 13A, the wiring substrate 200 includes a wiring layer 201, an insulation layer 202 that covers the wiring layer 201, via wirings 203 that extend through the insulation layer 202 in the thickness-wise direction, and connection terminals 204 that are electrically connected to the wiring layer 201 by the via wirings 203 and project upward from an upper surface 202A of the insulation layer 202. The wiring substrate 200 further includes a protective insulation layer 205, which is formed on the upper surface 202A of the insulation layer 202 to cover a lower side surface of each connection terminal 204, and a surface-processed layer 206, which covers an upper surface and an upper side surface of each connection terminal 204 exposed from the protective insulation layer 205. An upper surface of the protective insulation layer 205 is flat and generally parallel to the upper surface 202A of the insulation layer 202. The surface-processed layer 206 covers the upper side surface of each connection terminal 204 and extends generally orthogonal to upper surface of the protective insulation layer 205. In the wiring substrate 200, the level of adhesion is low between the surface-processed layer 206 and the protective insulation layer 205. This forms a gap S1 between the lower surface of the surface-processed layer 206 and the upper surface of the protective insulation layer 205, as illustrated in FIG. 13B.

In the wiring substrate 200, for example, connection terminals 207 of a semiconductor chip are flip-chip-connected to the surface-processed layer 206 by a solder layer 208. When flip-chip-connecting the connection terminals 207, the molten solder layer 208 concentrates at the side surfaces of the surface-processed layer 206 because of surface tension. This rounds the solder layer 208 such that a bounding portion having an arcuate cross section forms between the protective insulation layer 205 and the lower end of each side surface of the surface-processed layer 206. Further, the solder layer 208 enters the gap S1 between the lower surface of the surface-processed layer 206 and the upper surface of the protective insulation layer 205. The gap S1 extends horizontally from the bounding portion between the protective insulation layer 205 and the lower end of each side surface of the surface-processed layer 206. Thus, the solder layer 208 easily enters the gap S1 due to surface tension (capillary action). When solder layer 208 enters the gap S1, electromigration occurs between the solder layer 208 and the connection terminal 204 (e.g., Cu layer). This lowers the connection reliability of the solder layer 208 with respect to the surface-processed layer 206 and the connection terminal 204.

In contrast, referring to FIG. 2B, the wiring substrate 10 of the present embodiment includes the protrusions 71 that are upwardly bulged in the upper surface of the protective insulation layer 70. Further, in addition to the surface of each connection terminal 52 exposed from the protective insulation layer 70, the surface-processed layer 80 partially covers each protrusion 71 (slope 73, peak 72, and part of slope 74). Thus, the lower surface of the surface-processed layer 80 is shaped in conformance with part of each protrusion (slope 73, peak 72, and part of slope 74). That is, the lower surface of the surface-processed layer 80 is upwardly inclined toward the peak 72 from the outermost edge of the surface-processed layer 80. Thus, even when a gap is formed between the lower surface of the surface-processed layer 80 and the upper surface of the protective insulation layer 70, the gap is upwardly inclined toward the peak 72 from the bounding portion between the lower end of the side surface of the surface-processed layer 80 and the protective insulation layer 70. Consequently, the molten solder layer 93 that enters the gap between the lower surface of the surface-processed layer 80 and the upper surface of the protective insulation layer 70 is limited when flip-chip-connecting the connection terminals 92. This is because the surface tension component of the solder layer 93 acting along the slope 74 (in extending direction of the gap) is smaller than that of the wiring substrate 200 illustrated in FIG. 13B. Thus, the solder layer 93 that enters the gap is limited. Further, when the gap is formed, the gap is formed so as to bulge upward in conformance with the shape of the protrusion 71. Thus, the distance of the gap from the open end of the gap (i.e., lower end of side surface of surface-processed layer 80) to the side surface of the connection terminal 52, that is, the entering path of the solder layer 93 is longer than that of the wiring substrate 200. Accordingly, the entrance of the solder layer 93 through the gap to a position where it contacts the side surface of the connection terminal 52 is limited in a preferred manner. This limits the occurrence of electromigration between the solder layer 93 and the connection terminal 52 in a preferred manner.

A method for manufacturing the wiring substrate 10 will now be described.

Figure 3A:
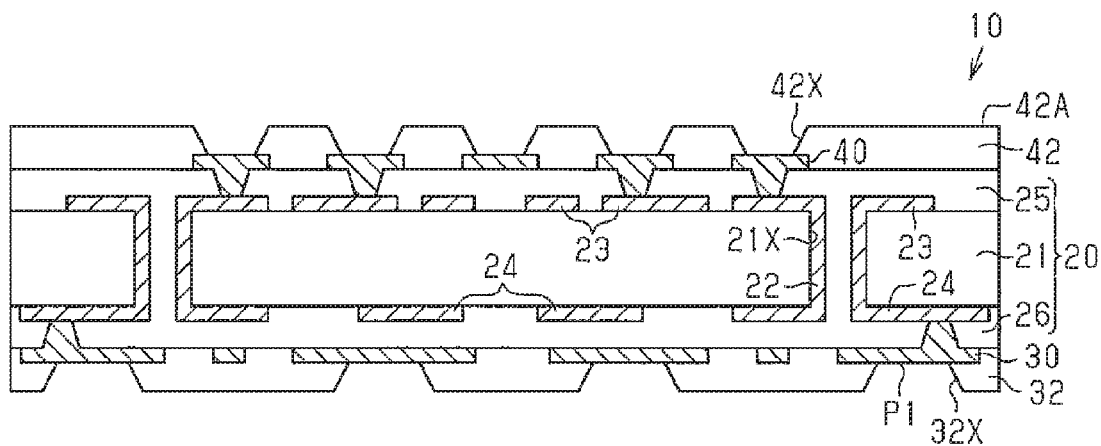
FIGS. 3A to 3C are schematic cross-sectional views illustrating one embodiment of a method for manufacturing the wiring substrate.

The wiring substrate 10 illustrated in FIG. 3A is first prepared. The wiring substrate 10 includes the wiring layer 50, the protective insulation layer 70, and the surface-processed layer 80. The wiring substrate 10 illustrated in FIG. 3A may be manufactured through a known method. The method for manufacturing the wiring substrate 10 of FIG. 3A will now be briefly described.

The through holes 21X are first formed in the core substrate 21 at certain locations. Then, the wall surfaces of the core substrate 21 that define the through holes 21X are plated to form the through electrodes 22. The wiring layers 23 and 24, which are electrically connected to the through electrodes 22, are formed by performing, for example, a subtractive process. A resin film is vacuum-laminated to the upper surface and the lower surface of the core substrate 21, and the resin film is heated and hardened to form the insulation layers 25 and 26. A resin paste or resin liquid may be applied to and heated on the upper surface and the lower surface of the core substrate 21 to form the insulation layers 25 and 26. Openings are formed in the insulation layers 25 and 26 and, when necessary, a desmearing process is performed. Then, for example, a semi-additive process is performed to form the wiring layers 30 and 40. Then, the solder resist layer 32 is formed on the lower surface of the insulation layer 26, and the openings 32X are formed in the solder resist layer 32 to expose portions of the lower surface of the wiring layer 30 as the external connection pads P1. Further, the insulation layer 42 is formed on the upper surface of the insulation layer 25, and the through holes 42X are formed in the insulation layer 42 to expose portions of the upper surface of the wiring layer 40.

Figure 3B:
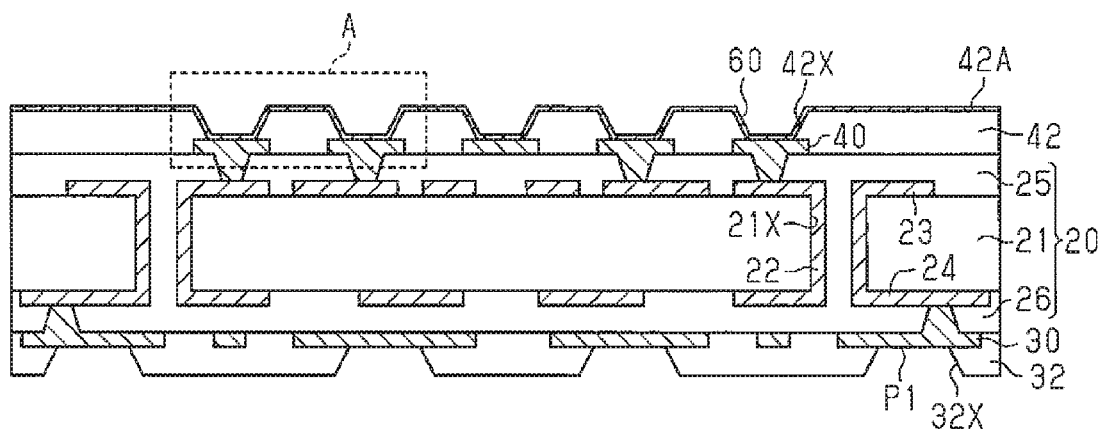
Figure 3C:
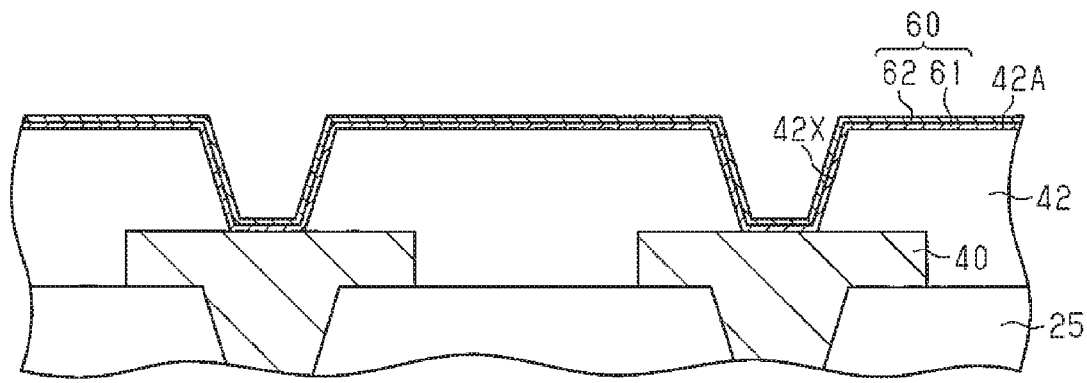

In the step of FIG. 3B, the seed layer 60 is formed continuously covering the upper surface 42A of the insulation layer 42, the wall surfaces of the insulation layer 42 that define the through holes 42X, and the wiring layer 40 exposed from the through holes 42X. The seed layer 60 may be formed through, for example, a sputtering process or an electroless plating process. In the present example, the seed layer 60 is formed through a sputtering process. In this case, referring to FIG. 3C, titanium is sputtered against and deposited on the entire upper surface 42A of the insulation layer 42, the entire wall surfaces of the insulation layer 42 that define the through holes 42X, and the entire upper surface of the wiring layer 40 exposed from the through holes 42X to form the metal film 61 (Ti layer). Then, copper is sputtered against and deposited on the metal film 61. This forms the seed layer 60 having the two-layer structure (Ti layer/Cu layer). FIG. 3C is an enlarged cross-sectional view of portion A (refer to box indicated by broken lines) in the structure of FIG. 3B.

Figure 4A:
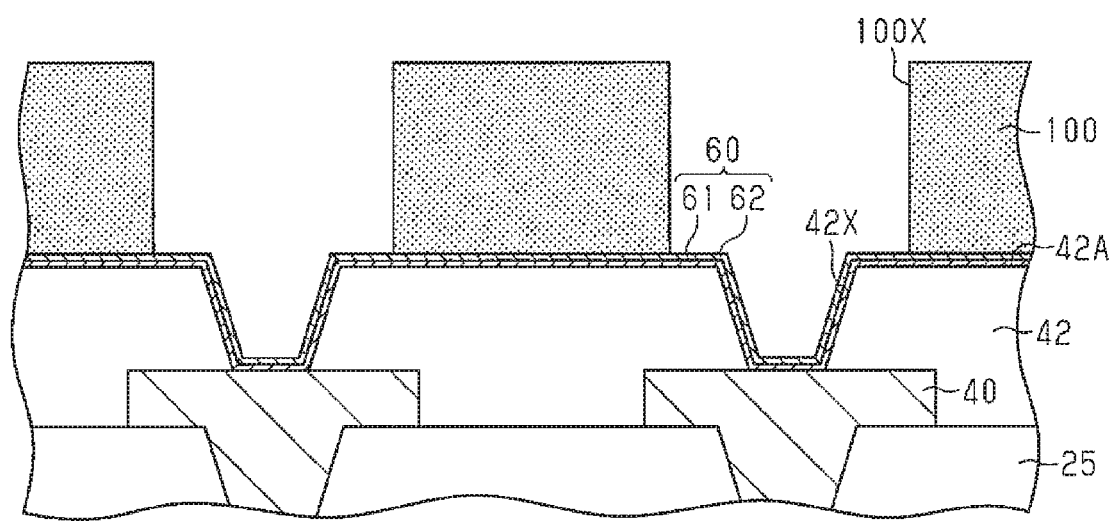
FIGS. 4A, 4B, 5A, 5B, 6A, 6B, 7A, and 7B are schematic cross-sectional views illustrating a method for manufacturing the wiring substrate of FIG. 1A.

In the step of FIG. 4A, a resist layer 100 including opening patterns 100X at certain locations is formed on the seed layer 60, which is formed on the upper surface 42A of the insulation layer 42. The opening patterns 100X expose the seed layer 60 at portions corresponding to regions where the connection terminals 52 (refer to FIG. 1A) are formed. The resist layer 100 may be formed from a material that is resistant to plating performed in the following step. For example, a photosensitive dry film resist of a photoresist liquid may be used for the resist layer 100. For example, a novolac resin or an acrylic resin may be used as the material of such a resist. When using, for example, a photosensitive dry film resist, thermal compression is performed to laminate a dry film onto the upper surface of the metal film 62. Then, photolithography is performed to pattern the dry film and form the resist layer 100 that includes the opening patterns 100X. When using a photoresist liquid, the same steps are performed to form the resist layer 100.

Figure 4B:
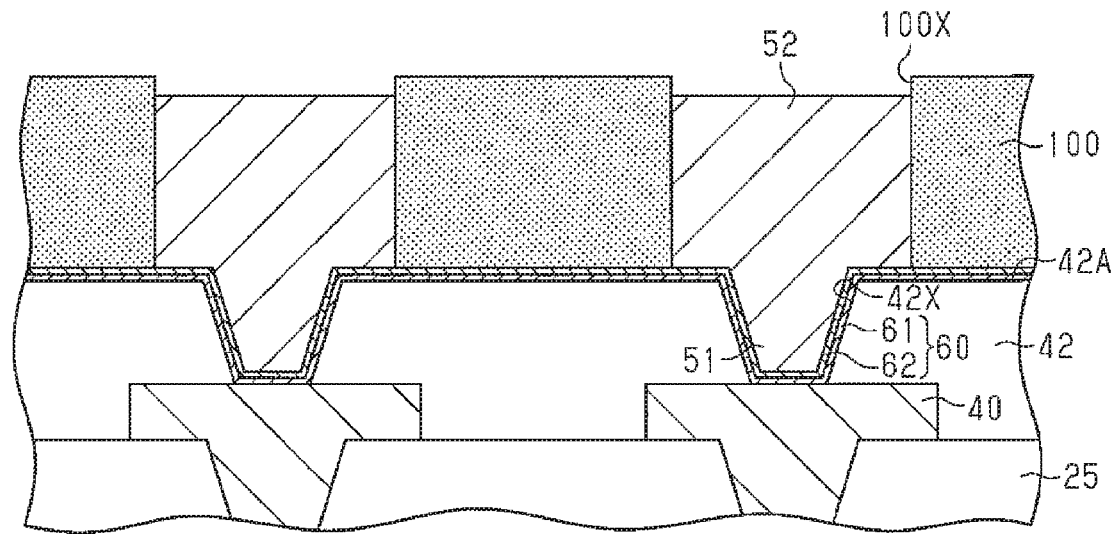

In the step of FIG. 4B, electrolytic plating (here, electrolytic copper plating) is performed on the upper surface of the seed layer 60 using the resist layer 100 as a mask and the seed layer 60 as a plating power supply layer to form the via wirings 51 and the connection terminals 52 on the upper surface of the seed layer 60 exposed from the opening patterns 100X of the resist layer 100.

Figure 5A:
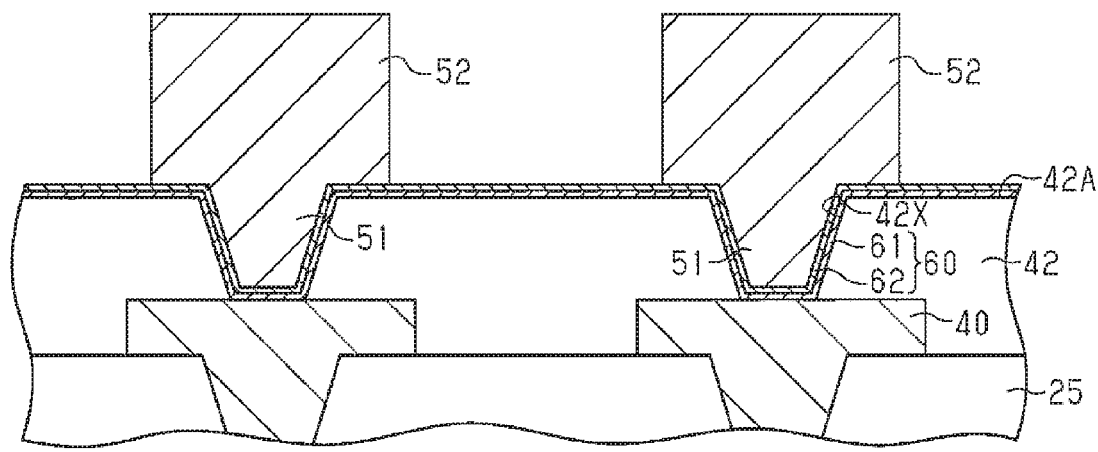
Figure 5B:
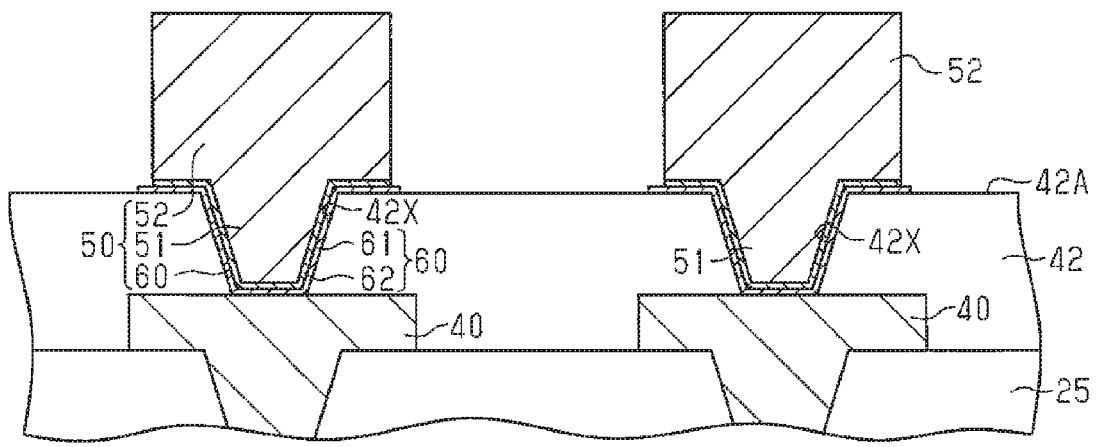

In the step of FIG. 5A, the resist layer 100 illustrated in FIG. 4B is removed with, for example, an alkaline delamination liquid. In the step of FIG. 5B, the seed layer 60 that is unnecessary is etched and removed using the connection terminals 52 as an etching mask. This forms the seed layer 60 and the via wirings 51 in the through holes 42X. Further, the connection terminals 52 are formed on the via wirings 51 and the seed layer 60 on the insulation layer 42. In this manner, the wiring layer 50 is formed including the seed layer 60, the via wirings 51, and the connection terminals 52.

Figure 6A:
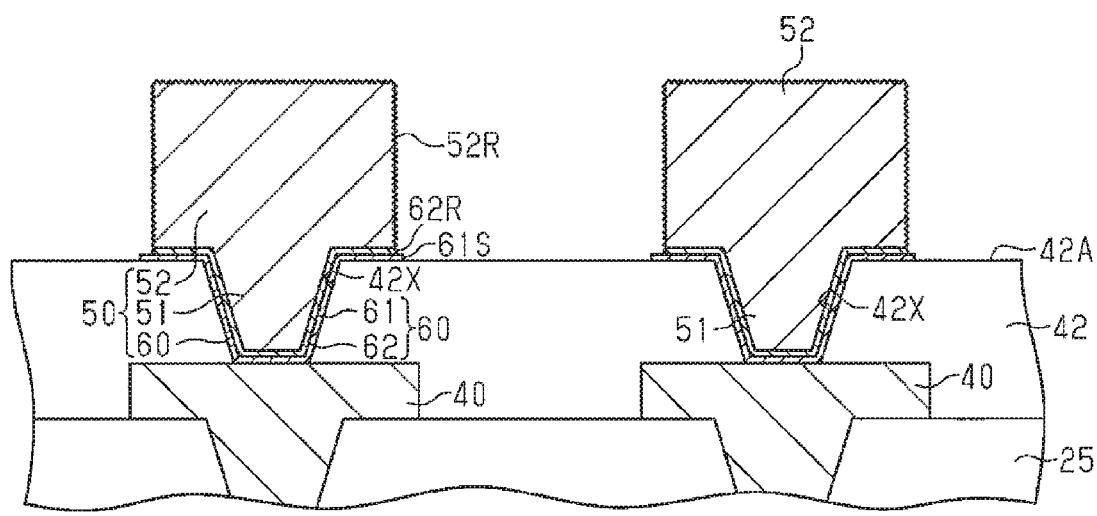

In the step of FIG. 6A, a roughening process is performed on the wiring layer 50 exposed from the insulation layer 42, that is, on the connection terminals 52 and the seed layer 60. In the present example, the roughening process is performed on the Cu layer (connection terminals 52 and metal film 62) in the wiring layer 50. The roughening process forms the roughened surfaces 62R having fine irregularities in the side surfaces of the metal film 62. Further, the roughening process forms the roughened surfaces 52R in the upper surface and the side surface of each connection terminal 52. For example, the surface roughness of the connection terminals 52 and the metal film 62 is approximately 1000 to 2000 nm in surface roughness Rz value prior to the roughening, whereas the surface roughness of the connection terminals 52 and the metal film 62 is approximately 2000 to 4000 nm in surface roughness Rz value subsequent to the roughening. In other words, the roughening process is performed so that the surface roughness of the connection terminals 52 and the metal film 62 becomes approximately 2000 to 4000 nm in Rz value.

The roughening process may be performed through, for example, an etching process, a black oxidation process, or a CZ process. When performing an etching process as the roughening process, for example, selective etching is performed so as not to roughen the surface of the metal film 61 (e.g., Ti layer). That is, conditions such as the etching liquid are set to etch the connection terminals 52 and the metal film 62 (e.g., Cu layer) and not to etch the metal film 61. Thus, the metal film 61 is hardly affected by the roughening process, and the surface of the metal film 61 remains as the low-roughness surface 61S without being roughened. When the surfaces of the connection terminals 52 and the metal film 62 are partially etched by the roughening process, the connection terminals 52 and the metal film 62 are decreased in size in a plan view. Thus, the outer edge of the metal film 61 extends toward the outer side from the connection terminal 52 and the side surface of the metal film 62. The etching liquid used for the roughening process (etching process) may be, for example, a ferric chloride aqueous solution, a copper(II) chloride aqueous solution, an ammonium persulfate aqueous solution, a copper ammonium chloride aqueous solution, or the like.

Figure 6B:
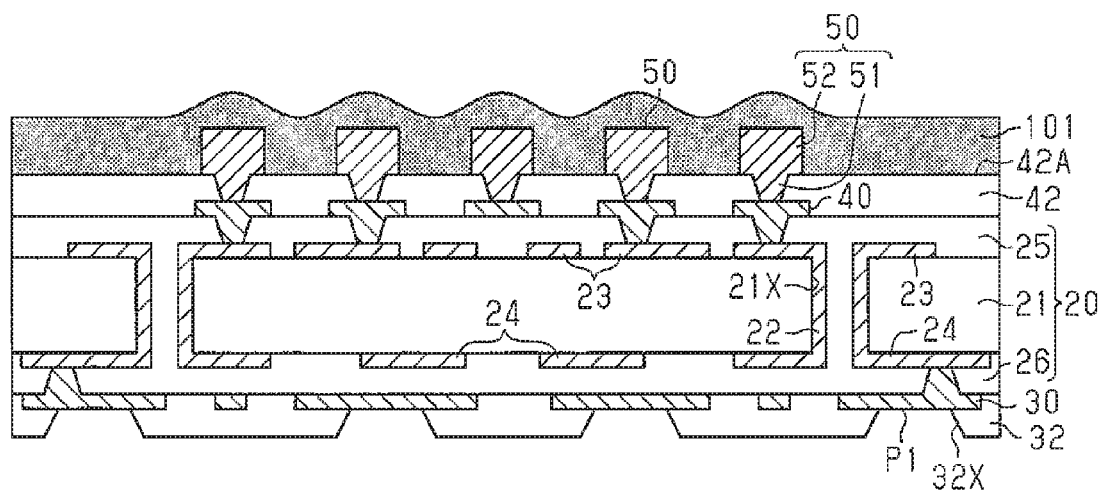

In the step of FIG. 6B, a photosensitive resin layer 101 that covers the entire surface (side surface and upper surface) of each connection terminal 52 is formed on the upper surface 42A of the insulation layer 42. The photosensitive resin layer 101 may be formed by applying a varnish of photosensitive resin to the upper surface 42A of the insulation layer 42 through a spin coating process. In the present embodiment, the photosensitive resin layer 101 is formed from a positive photosensitive resist.

Figure 7A:
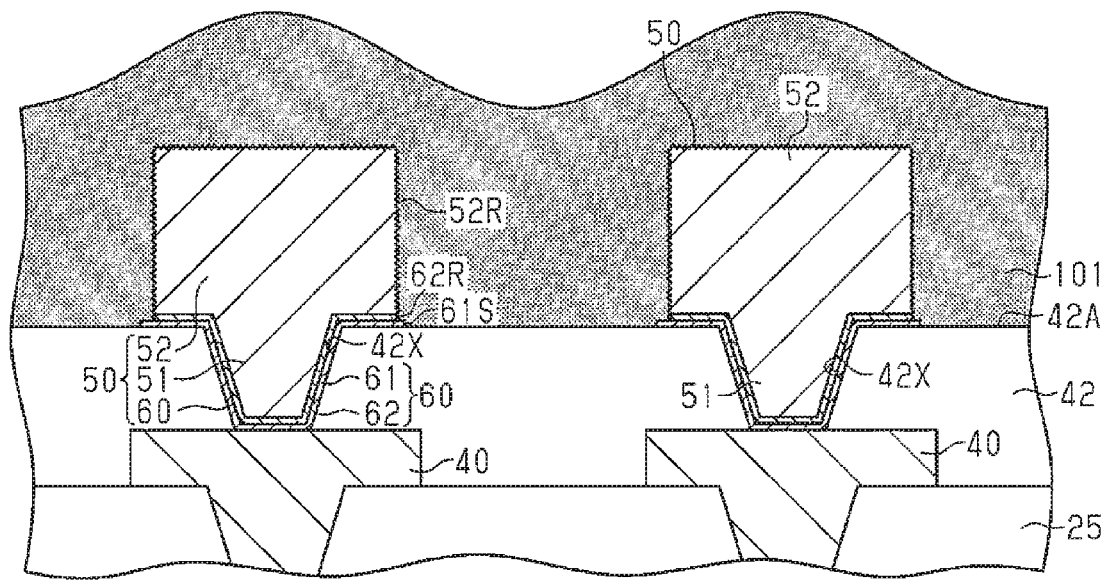

The thickness of the photosensitive resin layer 101 is set to allow the photosensitive resin layer 101 to entirely cover each connection terminal 52. The photosensitive resin layer 101 undulates in accordance with the difference in height between the insulation layer 42 and the connection terminals 52. Thus, the upper surface of the photosensitive resin layer 101 is high at positions corresponding to the connection terminals 52 and low at positions corresponding to between the connection terminals 52. Referring to FIG. 7A, the photosensitive resin layer 101 contacts and covers the roughened surfaces 62R and 52R and the low-roughness surface 61S of the wiring layer 50. This improves the adhesion between the wiring layer 50 and the photosensitive resin layer 101 as compared with when the surface of the wiring layer 50 is entirely smooth.

Figure 7B:
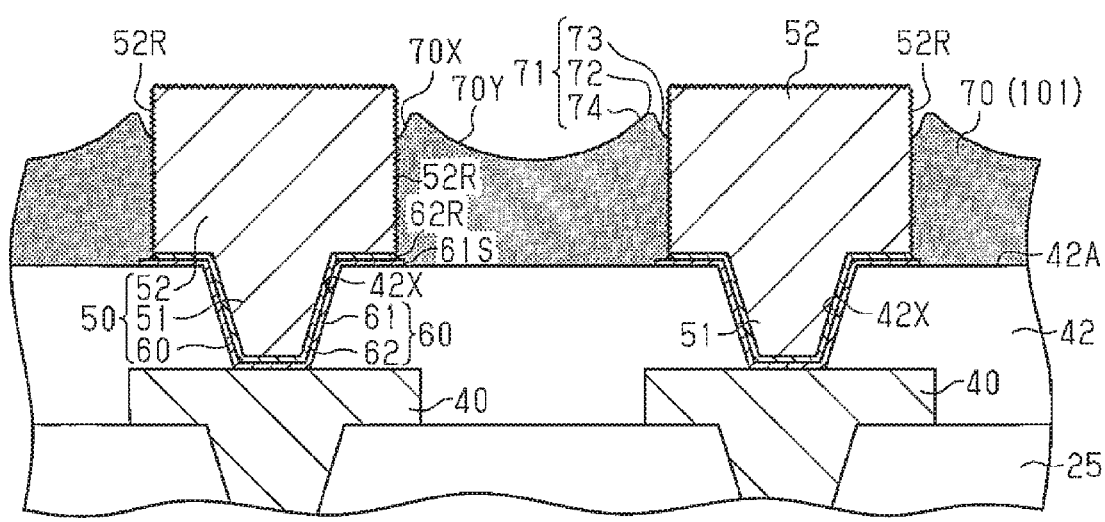

In the step of FIG. 7B, the photosensitive resin layer 101 is reduced in thickness. In the present example, the entire surface of the photosensitive resin layer 101 is dissolved with a developer to reduce the thickness of the photosensitive resin layer 101 and expose the upper end of each connection terminal 52. For example, the photosensitive resin layer 101 is dissolved in a non-exposed state with a developer and reduced in thickness. For example, tetramethylammonium hydroxide (TMAH) may be used as the developer.

In a positive photosensitive resin layer, patterns are normally formed by increasing the dissolving rate with the developer at exposed portions. Non-exposed portions of the photosensitive resin layer are dissolved by the developer although the dissolving rate is quite low. In the preferred embodiment, such characteristics are used to control the removed amount of the photosensitive resin layer 101 so that the photosensitive resin layer 101 remains between the connection terminals 52, with the upper ends of the connection terminals 52 projecting out of the photosensitive resin layer 101. Here, the photosensitive resin layer 101, which undulates as illustrated in FIG. 7A, is entirely reduced in thickness. Thus, the recess 70Y is formed in the upper surface of the photosensitive resin layer 101 remaining between the connection terminals 52. In the present embodiment, the photosensitive resin layer 101 that is reduced in thickness exposes the upper side surface of each connection terminal 52 in addition to the upper surface of the connection terminal 52 from the photosensitive resin layer 101.

Referring to FIG. 7B, when removing the photosensitive resin layer 101 with the developer, the photosensitive resin layer 101 is apt to dissolve in extremely small portions that extend into recesses in the side surface (i.e., roughened surface 52R) of the connection terminal 52 as soon as the upper surface of each connection terminal 52 is exposed from the photosensitive resin layer 101. Thus, a large amount of the developer enters the interface between the side surface (roughened surface 52R) of the connection terminal 52 and the photosensitive resin layer 101. This forms the recess 70X in the photosensitive resin layer 101 around each connection terminal 52. The recesses 70X and 70Y form the protrusion 71, which is bulged upward and includes the peak 72 and the slopes 73 and 74, in the upper surface of the photosensitive resin layer 101 around each connection terminal 52.

Figure 8A:
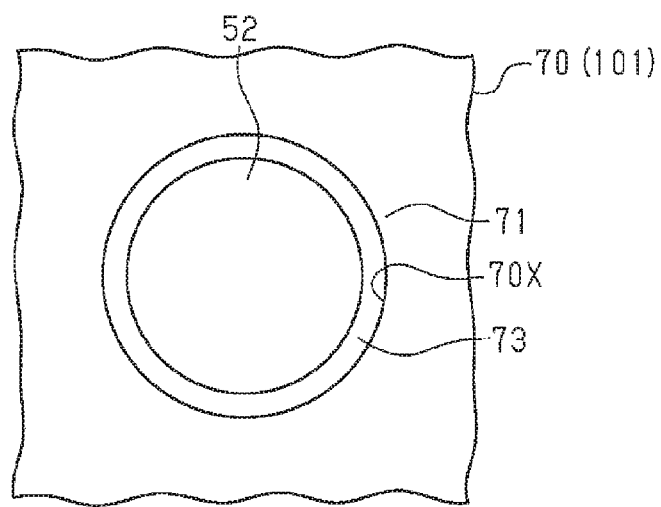
FIG. 8A is a schematic plan view of a connection terminal illustrated in FIG. 7B.
Figure 8B:
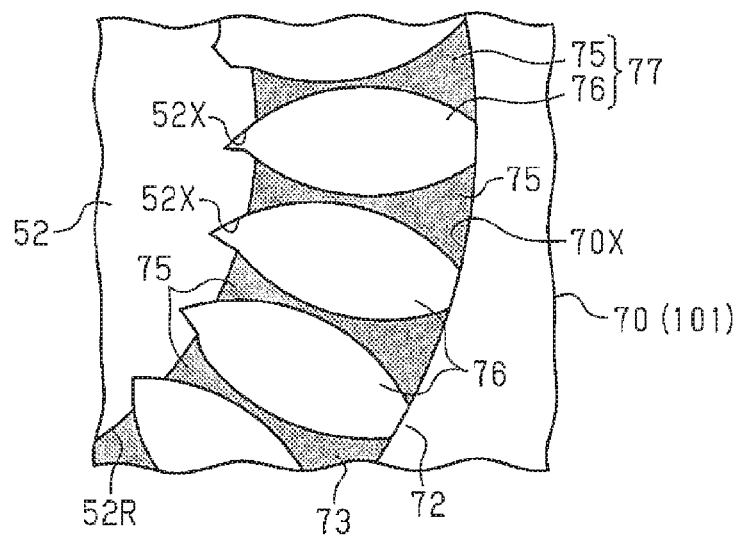
FIG. 8B is a partial, enlarged plan view of FIG. 8A.
Figure 8C:
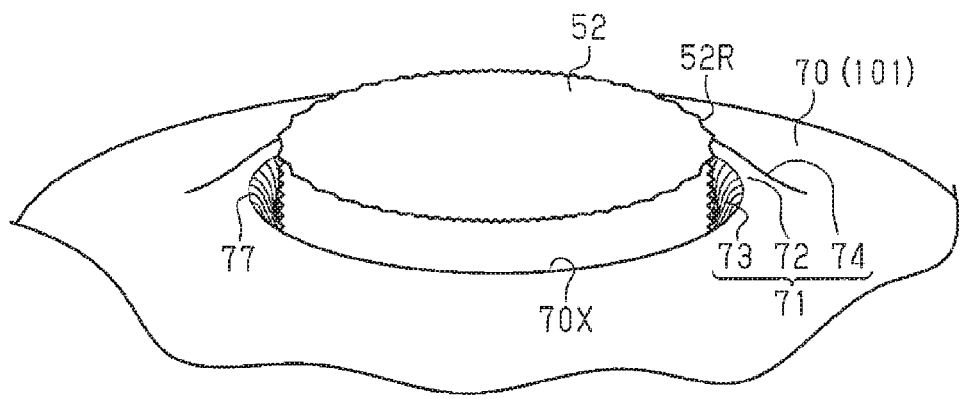
FIG. 8C is a schematic perspective view of the connection terminal illustrated in FIG. 7B.

Referring to FIGS. 8A and 8C, the recess 70X surrounds the corresponding connection terminal 52 in a plan view. For example, the recess 70X is annular and formed around the circumference of the connection terminal 52. Further, referring to FIG. 8B, the surface of the slope 73 defining the wall of the recess 70X includes elongated projections 75 that are arranged in a corrugated manner and extend in the widthwise direction of the recess 70X (i.e., toward the connection terminal 52 from the peak 72). The projections 75 project upward from a bottom surface 76 of the slope 73. In other words, the bottom surface 76 of the slope 73 is divided by the projections 75 into a plurality of bottom surface regions. Accordingly, the projections 75 and the bottom surface 76 (bottom surface regions) form a corrugation 77 in the surface of the slope 73.

Further, crack-like elongated grooves 52X, which resembles cracks, are formed in the upper side surface (roughened surface 52R) of the connection terminal 52 exposed from the protective insulation layer 70 in the recess 70X. The grooves 52X are, for example, located at a position corresponding to the location of the bottom surface 76 (bottom surface regions). It is assumed that this is because the bottom surface 76, or the corrugation 77, is formed as a large amount of the developer is supplied to the grooves 52X.

Figure 9A:
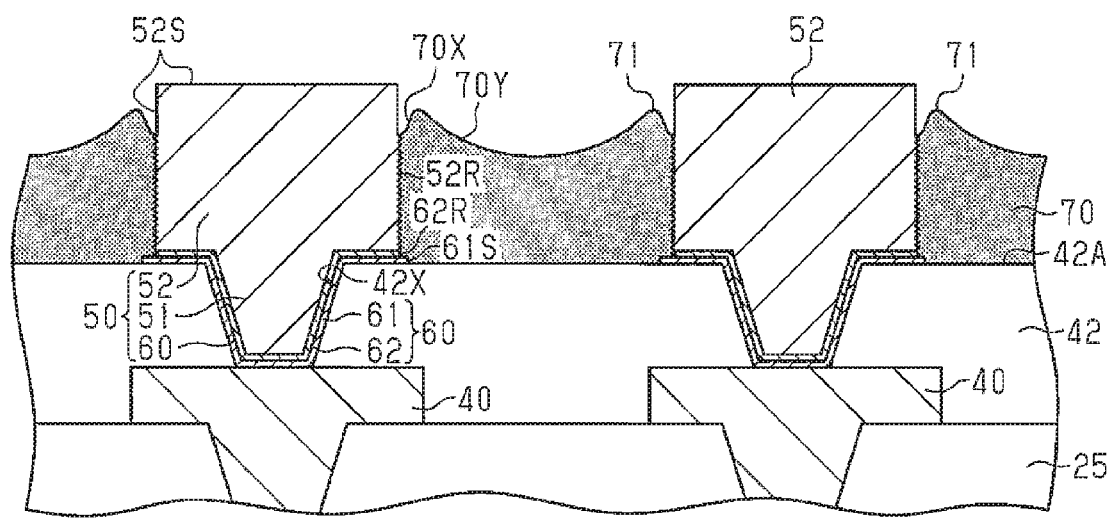
FIGS. 9A and 9B are schematic cross-sectional views illustrating the method for manufacturing the wiring substrate subsequent to the step of FIG. 7B.

Then, the photosensitive resin layer 101 is heated and hardened. As illustrated in FIG. 9A, this forms the protective insulation layer 70, which includes the protrusion 71 around each connection terminal 52 and covers the lower side surface of the connection terminal 52, on the upper surface 42A of the insulation layer 42.

In the present example, the positive photosensitive resin layer 101 is used as the protective insulation layer 70 (refer to FIG. 7B). Instead, a negative photosensitive resin layer may be used as the protective insulation layer 70. In this case, the rate at which the negative photosensitive resin layer is dissolved by the developer becomes quite low when the entire surface of the photosensitive resin layer is exposed. Such characteristics may be used to control the reduction in thickness (removed amount) of the negative photosensitive resin layer in the same manner as the positive photosensitive resin layer. Alternatively, a non-photosensitive resin layer may be used as the protective insulation layer 70, and the thickness of the non-photosensitive resin layer may be reduced by using the optimal wet etchant. Even in this case, the roughened surface 52R formed in the side surface of each connection terminal 52 functions to form the recess 70X (thus, the protrusion 71) in the non-photosensitive resin layer around each connection terminal 52.

In the step of FIG. 9A, soft etching is performed to clean the upper side surface and the upper surface of each connection terminal 52 exposed from the protective insulation layer 70. The soft etching etches and removes ridges from the upper side surface and upper surface (roughened surfaces 52R) of each connection terminal 52. This reduces the irregularities (i.e., roughness) in the upper side surface and upper surface of the connection terminal 52 as compared with the irregularities in the upper side surface and upper surface of the connection terminal 52 prior to the soft etching. As a result, the upper side surface and upper surface of the connection terminal 52 are each formed as the low-roughness surface 52S having a lower roughness than the roughened surface 52R. The low-roughness surface 52S has a lower surface roughness than the lower side surface (i.e., roughened surface 52R) of the connection terminal 52 covered by the protective insulation layer 70. In the present example, soft etching is performed so that the low-roughness surface 52S has a surface roughness Rz value of approximately 500 to 1000 nm. The soft etching may use, for example, an etching liquid of which the main components are sulfuric acid and hydrogen peroxide.

Figure 9B:
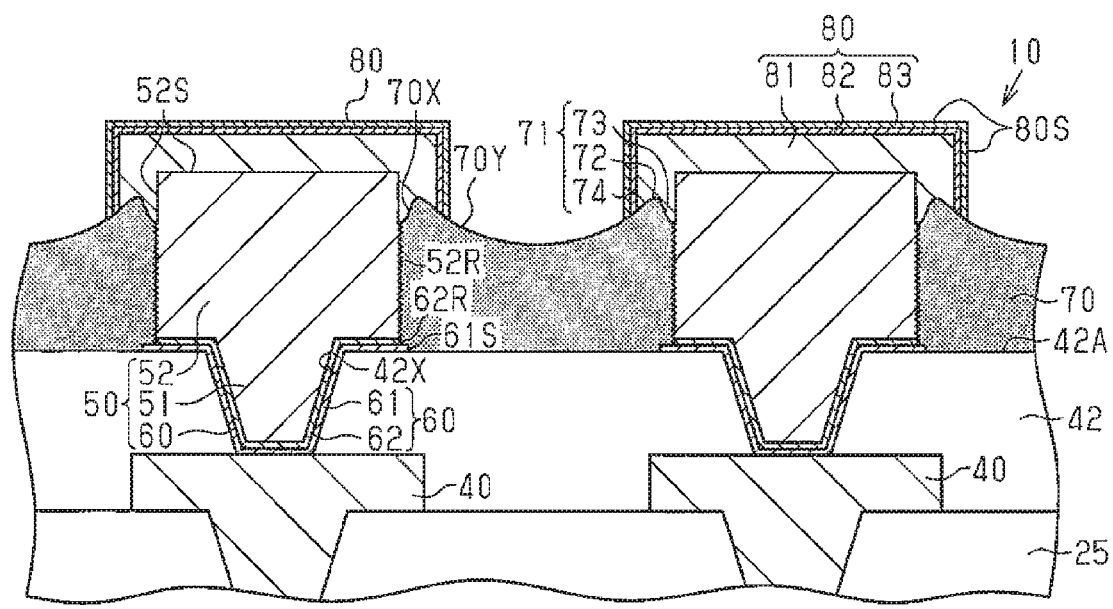

In the step of FIG. 9B, the surface-processed layer 80 is formed covering the upper side surface and the upper surface, namely, the low-roughness surfaces 52S of each connection terminal 52 exposed from the protective insulation layer 70. For example, an electroless Ni plating process is first performed to form the metal layer 81 that covers the low-roughness surfaces 52S and part of the protrusion 71 (slope 73, peak 72, and part of slope 74). The thickness of the metal layer 81 is set so that the metal layer 81 can cover from the end of the slope 73 contacting the connection terminal 52 to an intermediate part of the slope 74. Thus, the metal layer 81 covers the portion of the protrusion 71 that is bulged upward. Here, electroless Ni plating is deposited on the surface (low-roughness surface 52S) of each connection terminal 52 in an isotropic manner to form the metal layer 81. This forms a low-roughness surface having substantially the same surface roughness as the low-roughness surface 52S of the connection terminal 52 in the surface of the metal layer 81. Then, electroless Pd plating is performed to form the metal layer 82 that covers the upper surface and side surfaces of the metal layer 81 and part of the slope 74. Further, electroless Au plating is performed to form the metal layer 83 that covers the upper surface and the side surfaces of the metal layer 82 and part of the slope 74. This forms the surface-processed layer 80 having a three-layer structure that includes the metal layer 81, the metal layer 82, and the metal layer 83. The surfaces of the metal layers 82 and 83 have substantially the same surface roughness as the surface of the metal layer 81, that is, the low-roughness surfaces 52S of the connection terminal 52. Thus, the outermost surfaces of the surface-processed layer 80 (i.e., upper side surface and upper surface of metal layer 83) are formed as the low-roughness surfaces 80S that have a smaller roughness than the roughened surface 52R. The wiring substrate 10 illustrated in FIG. 1A is manufactured through the steps described above.

A method for manufacturing the semiconductor device 90 will now be described with reference to FIGS. 10A and 10B.

Figure 10A:
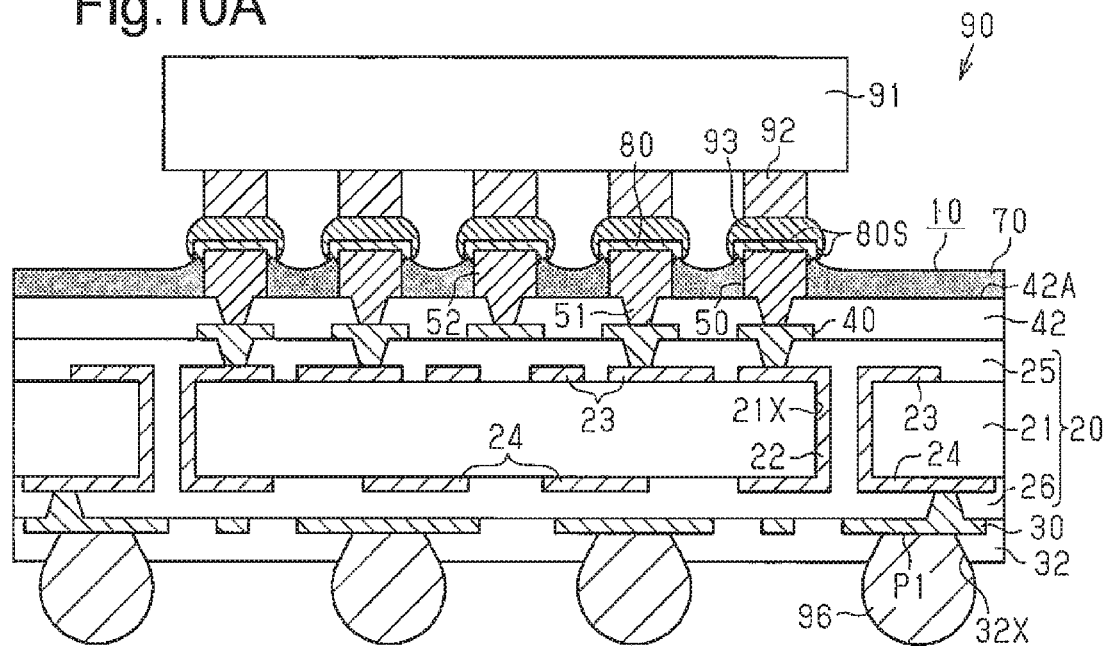
FIGS. 10A and 10B are schematic cross-sectional views illustrating the method for manufacturing the semiconductor device of FIG. 2A subsequent to the step of FIG. 9B.
Figure 10B:
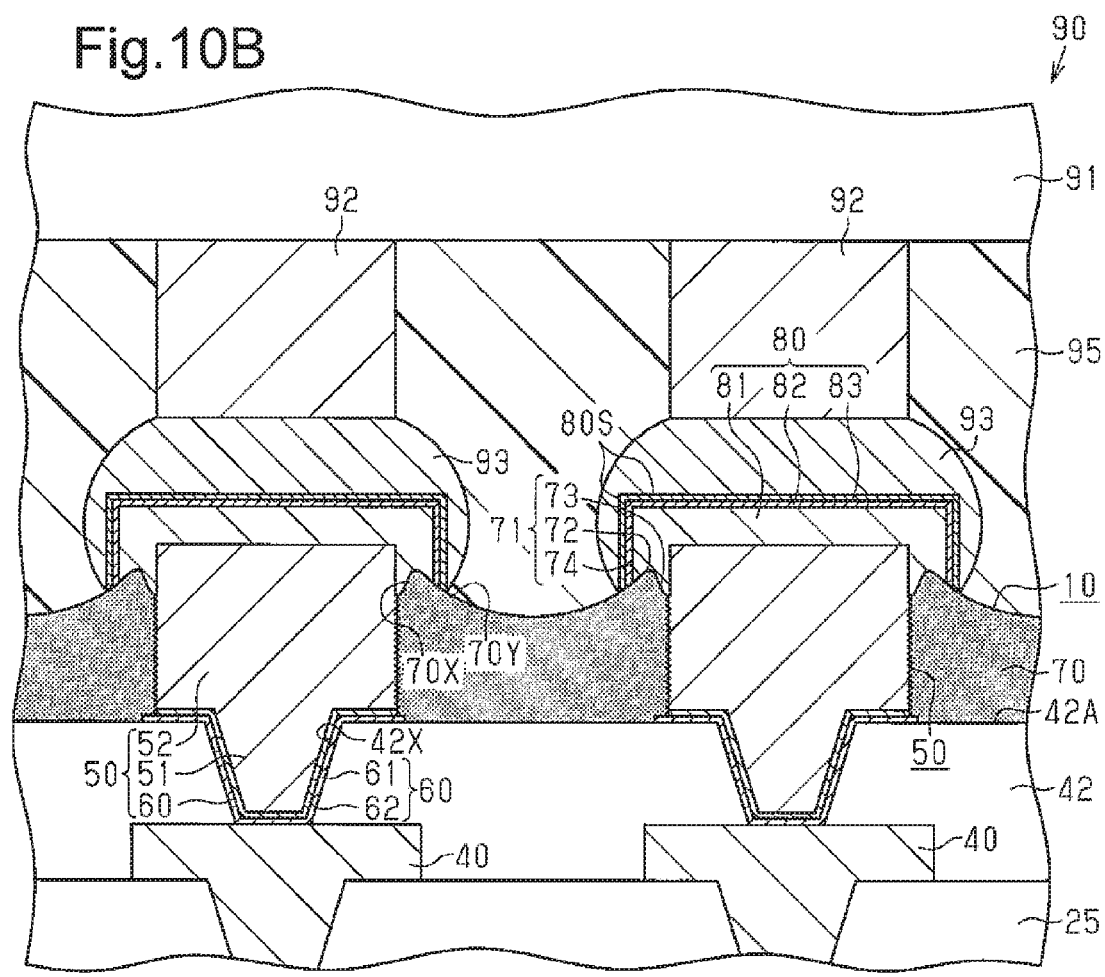

In the step of FIG. 10A, the external connection terminals 96 are formed on the external connection pads P1 of the wiring substrate 10. For example, a suitable amount of flux is applied to the external connection pads P1. Then, the external connection terminals 96 (solder balls) are mounted on the external connection pads P1, and a reflow process is performed at a temperature of approximately 240° C. to 260° C. This fixes the external connection terminals 96 to the external connection pads P1. Then, a surface-cleaning process is performed to remove the flux.

In the step of FIG. 10A, the semiconductor chip 91 including the rod-shaped connection terminals 92 is prepared. The connection terminals 92 are manufactured through a known method. The method is not illustrated in the drawings but will be now described briefly.

First, for example, a protective film including openings, from which electrode pads are exposed, are formed on the circuit formation surface (here, lower surface) of the semiconductor chip 91, and a seed layer is formed covering the lower surface of the protective film and the lower surface of each electrode pad. Then, a resist layer is formed exposing portions of the seed layer (seed layer covering lower surface of electrode pad) corresponding to regions where the connection terminals 92 are formed. Electrolytic plating (e.g., electrolytic copper plating) is performed on the seed layer using the seed layer exposed from the resist layer as a power supplying layer to form the rod-shaped connection terminals 92 on the electrode pads.

Then, the solder layer 93 is formed on the lower surface of each connection terminal 92. For example, electrolytic solder plating is performed using the resist layer formed on the seed layer as a mask, and solder is attached to the lower surface of each connection terminal 92 to form the solder layer 93. Then, the seed layer and the resist layer that are unnecessary are removed.

The connection terminals 92 of the semiconductor chip 91 are flip-chip-bonded to the surface-processed layer 80 of the wiring substrate 10. For example, after positioning the wiring substrate 10 and the semiconductor chip 91, a reflow process is performed to melt the solder layer 93 and electrically connect the solder layer 93 to the surface-processed layer 80. This electrically connects the connection terminals 92 to the connection terminals 52 via the solder layer 93 and the surface-processed layer 80. With reference to FIG. 10B, surface tension causes the molten solder layer 93 to concentrate at the side surfaces of the surface-processed layer 80 (side surfaces of metal layer 83). When a gap is formed between the lower surface of the surface-processed layer 80 and the upper surface of the protective insulation layer 70, the surface tension causes the solder layer 93 to enter the gap. However, in the present embodiment, the gap formed between the lower surface of the surface-processed layer 80 and the upper surface of the protective insulation layer 70 is upwardly inclined toward the peak 72 of the protrusion 71 from the outermost edge of the surface-processed layer 80. Thus, even when a gap is formed, entrance of the solder layer 93 into the gap is limited in a suitable manner.

Then, the space between the semiconductor chip 91 and the wiring substrate 10, which are flip-chip-bonded, is filled with the underfill material 95, and the underfill material 95 is hardened. The semiconductor device 90 illustrated in FIG. 2A is manufactured through the steps described above.

The present embodiment has the advantages described above.

(1) The protrusion 71 bulged upward is formed in the upper surface of the protective insulation layer 70 around each connection terminal 52. The surface-processed layer 80 covers part of the protrusion 71 (slope 73, peak 72, and part of slope 74) in addition to the surface (upper surface and upper side surface) of each connection terminal 52 exposed from the protective insulation layer 70. The lower surface of the surface-processed layer 80 is inclined upward from the outermost edge of the surface-processed layer 80 toward the peak 72 of the protrusion 71. Thus, even when a gap is formed between the lower surface of the surface-processed layer 80 and the upper surface of the protective insulation layer 70, the entrance of the molten solder layer 93 into the gap is limited in a preferred manner when flip-chip-connection is performed. This limits the occurrence of electromigration between the solder layer 93 and each connection terminal 52 in a preferred manner. As a result, the reliability of the connection of the solder layer 93 to the connection terminals 52 and the surface-processed layer 80 is improved. This, in turn, improves the reliability of the connection of the wiring substrate 10 and the semiconductor chip 91.

(2) The surface-processed layer 80 covers the upward bulging portion of each protrusion 71. This lengthens the entering path of the solder layer 93 and limits contact of the solder layer 93 with the side surface of each connection terminal 52 in a preferred manner. As a result, the occurrence of electromigration between the solder layer 93 and the connection terminal 52 is limited in a preferred manner.

(3) The surface-processed layer 80 covers the protrusion 71 of the protective insulation layer 70. Thus, the area of contact between the surface-processed layer 80 and the protective insulation layer 70 is larger than when a surface-processed layer is formed on a flat upper surface of a protective insulation layer. This improves the adhesion between the surface-processed layer 80 and the protective insulation layer 70. As a result, the formation of a gap between the surface-processed layer 80 and the protective insulation layer 70 is limited.

(4) The roughened surface 52R is formed in the lower side surface of each connection terminal 52 contacting the protective insulation layer 70. This produces an anchor effect and improves the adhesion of the connection terminal 52 and the protective insulation layer 70. This limits delamination of the protective insulation layer 70 from the side surface of each connection terminal 52 in a preferred manner. Delamination of the protective insulation layer 70 from the side surface of each connection terminal 52 may cause corrosion of the connection terminal 52, which is exposed from the surface-processed layer 80. Accordingly, by limiting the delamination of the protective insulation layer 70, the corrosion of the connection terminal 52 may be limited in a preferred manner.

(5) The low-roughness surface 52S, which has a smaller surface roughness than the roughened surface 52R, is formed in the upper side surface and upper surface of each connection terminal 52 exposed from the protective insulation layer 70. Thus, the low-roughness surface 80S may be formed in the side surfaces and upper surface of the surface-processed layer 80 that cover the low-roughness surface 52S of each connection terminal 52. This ensures the smoothness of the surface-processed layer 80 that functions as pads.

(6) The upper surface of the protective insulation layer 70 defines the recesses 70Y that are recessed in an arcuate manner toward the insulation layer 42 at a position between the adjacent connection terminals 52. The recesses 70Y improve the flowability of the underfill material 95.

It should be apparent to those skilled in the art that the foregoing embodiments may be employed in many other specific forms without departing from the scope of this disclosure. Particularly, it should be understood that the foregoing embodiments may be employed in the following forms.

Figure 11A:
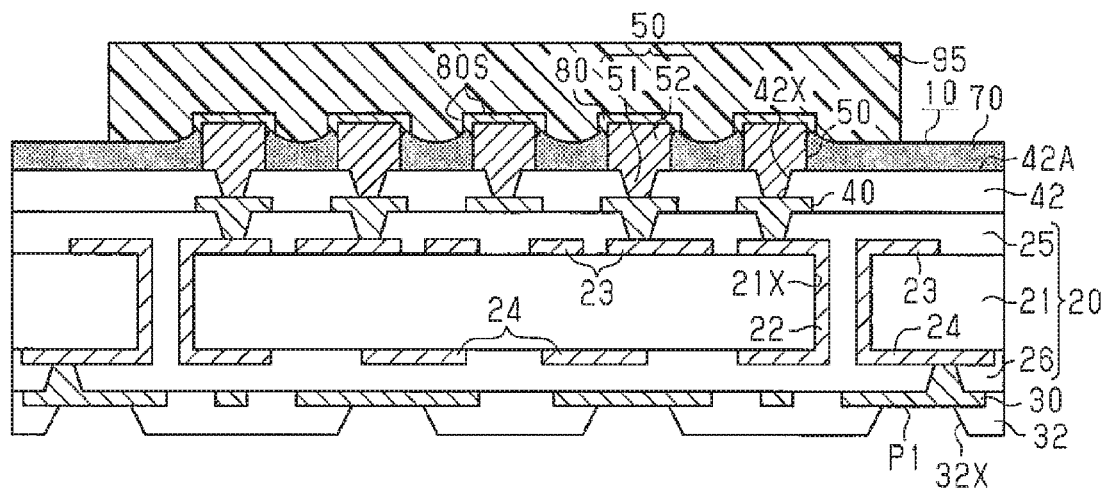
FIGS. 11A and 11B are schematic cross-sectional views illustrating a modified example of the method for manufacturing the semiconductor device.
Figure 11B:
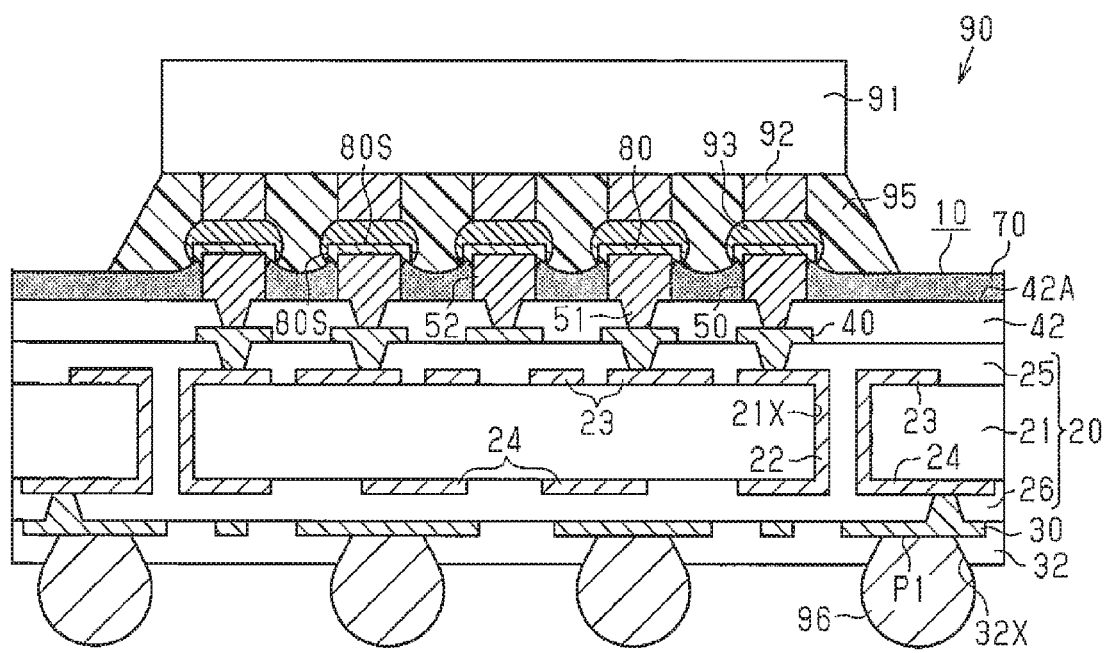

The semiconductor device 90 may be manufactured through the steps illustrated in FIGS. 11A and 11B. The steps of FIGS. 11A and 11B are performed in lieu of the steps of FIGS. 10A and 10B. The description will focus on differences from the above embodiment.

In the step of FIG. 11A, the underfill material 95, which covers the surface-processed layer 80, is formed on the upper surface of the protective insulation layer 70. The underfill material 95 is in a B-stage (semi-cured state). When the underfill material 95 is formed from a film of an insulative resin, the film of insulative resin is laminated onto the upper surface of the protective insulation layer 70. In this step, the film of insulative resin is not thermally hardened, and the underfill material 95 remains in the B-stage. When the underfill material 95 is formed from a liquid or paste of insulative resin, the liquid or paste of insulative resin is applied to the upper surface of the protective insulation layer 70 through, for example, a printing process or a dispenser process.

In the step of FIG. 11B, the semiconductor chip 91, which includes the rod-shaped connection terminals 92, is prepared. Then, the connection terminals 92 of the semiconductor chip 91 are flip-chip-bonded to the surface-processed layer 80 (connection terminals 52) of the wiring substrate 10. For example, the adhesiveness of the underfill material 95, which has not been thermally hardened, is first used to temporarily fix the semiconductor chip 91 to the wiring substrate 10. Then, for example, heat is generated at a temperature of approximately 190° C. to 300° C. to apply load to the rear surface (here, upper surface) of the semiconductor chip 91. As a result, the connection terminals 92 of the semiconductor chip 91 and the solder layer 93 penetrate the semi-hardened underfill material 95, and the connection terminals 92 come into contact with the surface-processed layer 80 with the solder layer 93 located in between. Then, a reflow process is performed to melt and harden the solder layer 93. This electrically connects the connection terminals 92 and the connection terminals 52 via the solder layer 93 and the surface-processed layer 80.

Further, a heating process is performed to thermally harden the underfill material 95. This covers the connection terminals 52 and 92, the solder layer 93, the surface-processed layer 80, and the like with the thermally hardened underfill material 95.

If the surface-processed layer 80, which is joined with the solder layer 93, were to include a surface that is roughened to the same level as the roughened surface 52R (refer to FIG. 1B), the resin and filler of the underfill material 95 would tend to get caught in the portion where the solder layer 93 and the surface-processed layer 80 are joined. This may lower the reliability of the electrical connection between the solder layer 93 and the surface-processed layer 80.

In this regard, in the wiring substrate 10, the upper side surface and upper surface of the surface-processed layer 80 that are joined with the solder layer 93 are formed as the low-roughness surfaces 80S having a smaller roughness than the roughened surface 52R. This limits situations in which resin or filler of the underfill material 95 gets caught in the portion where the solder layer 93 and the surface-processed layer 80 are joined. Thus, the reliability of the electrical connection is improved between the solder layer 93 and the surface-processed layer 80.

Figure 12:
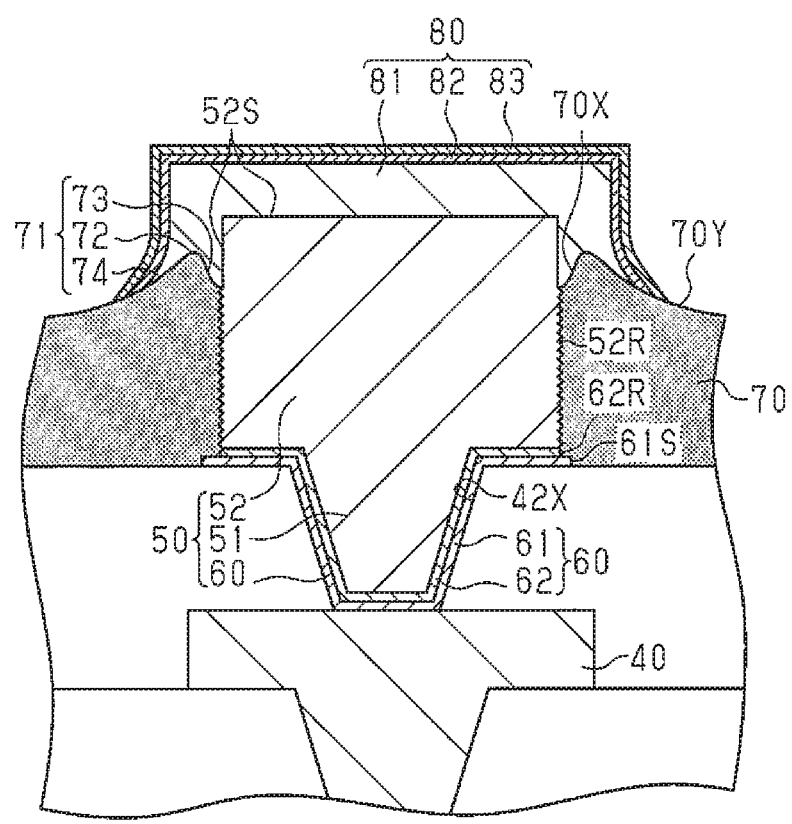
FIG. 12 is a schematic cross-sectional view illustrating a modified example of the wiring substrate.

Referring to FIG. 12, the lower end of the surface-processed layer 80 may be spread out along the slope 74. For example, the lower end (outer edge) of each of the metal layers 81 to 83 may be spread out along the slope 74. This increases the area of contact between the surface-processed layer 80 and the protective insulation layer 70. Thus, adhesion is improved between the surface-processed layer 80 and the protective insulation layer 70.

In the above embodiment and modified examples, the upper side surface and upper surface of each connection terminal 52 exposed from the protective insulation layer 70 are low-roughness surfaces 52S having a lower roughness than the roughened surface 52R. Instead, for example, the upper side surface and upper surface of each connection terminal 52 exposed from the protective insulation layer 70 may be a roughened surface having substantially the same roughness as the roughened surface 52R.

The side surface and upper surface of the surface-processed layer 80 may be a roughened surface having substantially the same roughness as the roughened surface 52R.

In the above embodiment and modified examples, the side surface of the metal film 61 may be a roughened surface.

In the above embodiment and modified examples, the side surface of the metal film 61 on the upper surface 42A of the insulation layer 42 is extended toward the outer side from the side surfaces of the connection terminal 52 and the metal film 62. Instead, for example, the side surface of the metal film 61 may be flush with the side surfaces of the connection terminal 52 and the metal film 62. Alternatively, the side surfaces of the connection terminal 52 and the metal film 62 may be extend toward the outer side from the side surface of the metal film 61.

In the above embodiment and modified examples, the electronic component is not limited to the semiconductor chip 91. Instead of the semiconductor chip 91, for example, a crystal oscillator or a chip component, such as a chip capacitor, a chip resistor, or a chip inductor, may be mounted on the wiring substrate 10 as the electronic component.

In the wiring substrate 10 of the above embodiment and modified examples, the structure located toward the inner side from the wiring layers 30 and 40, that is, the structure of the main substrate body 20, is not particularly limited. The main substrate body 20 need only have a structure electrically connecting the wiring layers 30 and 40 to each other through the main substrate body 20. For example, the structure and material of the core substrate 21 are not particularly limited. Further, the number of wiring layers (e.g. wiring layers 23 and 24) formed on the core substrate 21 and the number of insulation layers (e.g., insulation layers 25 and 26) covering the wiring layer are not particularly limited. Further, instead of a buildup substrate that includes the core substrate 21, the main substrate body 20 may be a coreless substrate that does not includes the core substrate 21.

CLAUSES

This disclosure also encompasses the following embodiments.

1. A method for manufacturing a wiring substrate, the method including:
   forming an insulation layer;
   forming a connection terminal that projects upward from an upper surface of the insulation layer;
   roughening a side surface and an upper surface of the connection terminal;
   forming a resin layer on the upper surface of the insulation layer, wherein the resin layer covers the side surface and the upper surface of the connection terminal and is undulated in accordance with a difference in height between the insulation layer and the connection terminal;
   forming a protective insulation layer by reducing the resin layer in thickness to expose an upper side surface and the upper surface of the connection terminal, wherein the protective insulation layer includes an upper surface that defines a protrusion bulged upward around the connection terminal; and
   forming a surface-processed layer that covers the upper side surface and the upper surface of the connection terminal exposed from the protective insulation layer, wherein the surface-processed layer covers part of the protrusion;
   wherein
   the protrusion includes
     a peak,
     a first slope inclined downward from the peak and extending toward the connection terminal that is located in the proximity of the peak, and
     a second slope inclined downward from the peak and extending away from the connection terminal that is located in the proximity of the peak, and
   the forming the surface-processed layer includes forming the surface-processed layer so as to cover the first slope, the peak, and part of the second slope.

2. The method according to clause 1, further including, after forming the protective insulation layer and before forming the surface-processed layer,
   roughening the upper side surface and the upper surface of the connection terminal exposed from the protective insulation layer so that the upper side surface and the upper surface of the connection terminal are formed as low-roughness surfaces that have a smaller surface roughness than a lower side surface of the connection terminal covered by the protective insulation layer.

3. The method according to clause 1 or 2, wherein
   the forming a resin layer includes applying a positive photosensitive resin to the upper surface of the insulation layer in order to form the resin layer, and
   the forming a protective insulation layer includes dissolving the resin layer in a non-exposed state with a developer in order to form the protective insulation layer.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:
   an insulation layer;
   a rod-shaped connection terminal projecting upward from an upper surface of the insulation layer, wherein the connection terminal is adapted to be connected to an electronic component;
   a protective insulation layer formed on the upper surface of the insulation layer to cover a lower side surface of the connection terminal;
   a cover layer that covers an upper surface of the connection terminal and an upper side surface of the connection terminal which are exposed from the protective insulation layer;
   wherein
   the protective insulation layer includes an upper surface that defines a protrusion bulged upward around the connection terminal,
   the protrusion includes
     a peak,
     a first slope inclined downward from the peak and extending toward the connection terminal that is located in the proximity of the peak, and
     a second slope inclined downward from the peak and extending away from the connection terminal that is located in the proximity of the peak, and
   the cover layer further covers the first slope, the peak, and a part of the second slope.

2. The wiring substrate according to claim 1, wherein the cover layer includes a lower end that is spread out along the second slope.

3. The wiring substrate according to claim 1, wherein the lower side surface of the connection terminal covered by the protective insulation layer has a larger surface roughness than the upper side surface and the upper surface of the connection terminal that are exposed from the protective insulation layer.

4. The wiring substrate according to claim 1, wherein
the cover layer includes a stack of metal layers,
one of the metal layers is a nickel layer formed from a metal material including nickel, and
the nickel layer covers the first slope, the peak, and the part of the second slope.

5. The wiring substrate according to claim 1, further comprising:
a wiring layer covered by the insulation layer;
a through hole extending through the insulation layer in a thickness-wise direction to expose an upper surface of the wiring layer;
a metal film that continuously covers the upper surface of the wiring layer exposed by the through hole, a wall surface of the insulation layer defining the through hole, and the upper surface of the insulation layer; and
a via wiring formed on the metal film within the through hole, wherein the through hole is filled with the via wiring;
wherein the connection terminal is formed on an upper surface of the via wiring and on an upper surface of the metal film outside the through hole.

6. The wiring substrate according to claim 1, wherein the first slope includes elongated projections arranged next to one another and extending from the peak toward the connection terminal, wherein the elongated projections form a corrugation in the first slope.

7. A semiconductor device comprising:
the wiring substrate according to claim 1; and
an electronic component mounted on the wiring substrate, wherein the electronic component includes a circuit formation surface on which a connection terminal is formed;
wherein the connection terminal of the electronic component is electrically connected to the cover layer of the wiring substrate by a solder layer.

* * * * *